(12) United States Patent
Ogawa et al.

(10) Patent No.: US 8,159,792 B2
(45) Date of Patent: Apr. 17, 2012

(54) MOTOR CONTROL DEVICE

(75) Inventors: Yasufumi Ogawa, Chiyoda-ku (JP);
Nozomu Kamioka, Chiyoda-ku (JP)

(73) Assignee: Mitsubishi Electric Corporation,
Tokyo (JP)

( * ) Notice: Subject to any disclaimer, the term of this patent is extended or adjusted under 35 U.S.C. 154(b) by 487 days.

(21) Appl. No.: 12/410,084

(22) Filed: Mar. 24, 2009

(65) Prior Publication Data

US 2010/0117582 A1     May 13, 2010

(30) Foreign Application Priority Data

Nov. 10, 2008    (JP) ................................ 2008-287660

(51) Int. Cl.
*H02H 7/08*       (2006.01)

(52) U.S. Cl. ......... 361/31; 361/1; 361/5; 361/6; 361/23; 361/62; 361/63; 318/432; 318/434; 318/490; 318/516; 702/57; 702/58; 702/59; 702/63; 702/64

(58) Field of Classification Search ............ 361/31, 361/1, 5, 6, 23, 30, 42, 62, 63; 318/432, 318/434, 490, 516; 702/57, 58, 59, 63, 64
See application file for complete search history.

(56) References Cited

U.S. PATENT DOCUMENTS

| | | | |
|---|---|---|---|
| 5,097,185 A * | 3/1992 | Ogasawara | 318/268 |
| 5,289,890 A * | 3/1994 | Toyoda et al. | 180/65.8 |
| 5,596,465 A * | 1/1997 | Honda et al. | 361/18 |
| 6,639,395 B2 * | 10/2003 | Male | 324/106 |
| 6,803,743 B2 * | 10/2004 | George et al. | 320/105 |
| 7,173,386 B1 * | 2/2007 | Jeon | 318/53 |
| 7,656,690 B2 * | 2/2010 | Yamada et al. | 363/71 |
| 7,939,969 B2 * | 5/2011 | Ichikawa et al. | 307/82 |

FOREIGN PATENT DOCUMENTS

| | | |
|---|---|---|
| JP | 06-233450 A | 8/1994 |
| JP | 2002-058288 A | 2/2002 |
| JP | 2004-312955 A | 11/2004 |
| JP | 2006-280152 A | 10/2006 |
| JP | 2007-325474 A | 12/2007 |

* cited by examiner

*Primary Examiner* — Rita Leykin
(74) *Attorney, Agent, or Firm* — Sughrue Mion, PLC

(57) ABSTRACT

In a motor control device that drives a plurality of motors with one DC power supply, detection of a short circuit fault occurring in the motors is realized with an inexpensive configuration. In order to drive the plurality of motors (105, 106), a current detection resistor (404, 405) is arranged between a connection point on positive terminal sides of a plurality of electric power converters (401, 402) connected in parallel to a DC power supply (403) and a positive terminal of the DC power supply, or also between a connection point on negative terminal sides of the plurality of electric power converters and a negative terminal (ground) of the DC power supply, to thereby detect the short circuit fault based on a voltage of the current detection resistor.

14 Claims, 17 Drawing Sheets

MOTOR CONTROL DEVICE

BACKGROUND OF THE INVENTION

1. Field of the Invention

The present invention relates to detection of a short circuit fault in a motor control device that drives a plurality of motors.

2. Description of the Related Art

There is known, as a fault detection technology for a motor drive system, for example, as disclosed in JP 06-233450 A, one in which a current detection resistor is placed on a DC bus line at each of a positive terminal side and a negative terminal side of an electric power converter that drives a motor, and when an overcurrent is detected by the current detection resistor, it is determined that a short circuit fault occurs.

When the conventional fault detection technology for the motor drive system is used in a motor control device that drives a plurality of motors, there arises such a problem that two current detection resistors are necessary for one electric power converter, resulting in an increase in cost.

Further, a current that flows in the DC bus line flows in synchronism with an on-timing of a switching element of the electric power converter. For that reason, in the case of detecting the current flowing in a current detection resistor which is arranged on the DC bus line by a microcomputer, there is a necessity of implementing A/D conversion in synchronism with the on-timing of the switching element of the electric power converter. In order to perform the A/D conversion in synchronism with the on-timing of the switching element in the manner described above, it is necessary to use the microcomputer with a high-precision timer, leading to a problem of high cost.

SUMMARY OF THE INVENTION

It is an object of the present invention to provide a motor control device with an inexpensive configuration which detects the short circuit fault in any one of a plurality of motors and electric power converters with the aid of one current detection resistor, thereby reducing the number of current detection resistors.

The present invention relates to a motor control device including: a DC power supply for feeding power to a plurality of motors; a plurality of electric power converters connected in parallel to the DC power supply, for performing power conversion of the fed power to drive the plurality of motors, respectively; motor driving means for controlling drive/stop of the plurality of electric power converters according to a motor drive command; a first current detection resistor connected between a point to which positive terminal sides of the plurality of electric power converters are connected and the DC power supply; and fault detecting means for detecting a short circuit fault based on a voltage of the first current detection resistor.

According to the present invention, there can be provided the motor control device with an expensive configuration which detects the short circuit fault in any one of the plurality of motors and electric power converters with the aid of the one current detection resistor, thereby reducing the number of current detection resistors.

DETAILED DESCRIPTION OF THE PREFERRED EMBODIMENTS

Hereinafter, a description is given of a motor control device of the present invention which is applied to an automatic transmission control device according to respective embodiments.

First Embodiment

Figure 1:
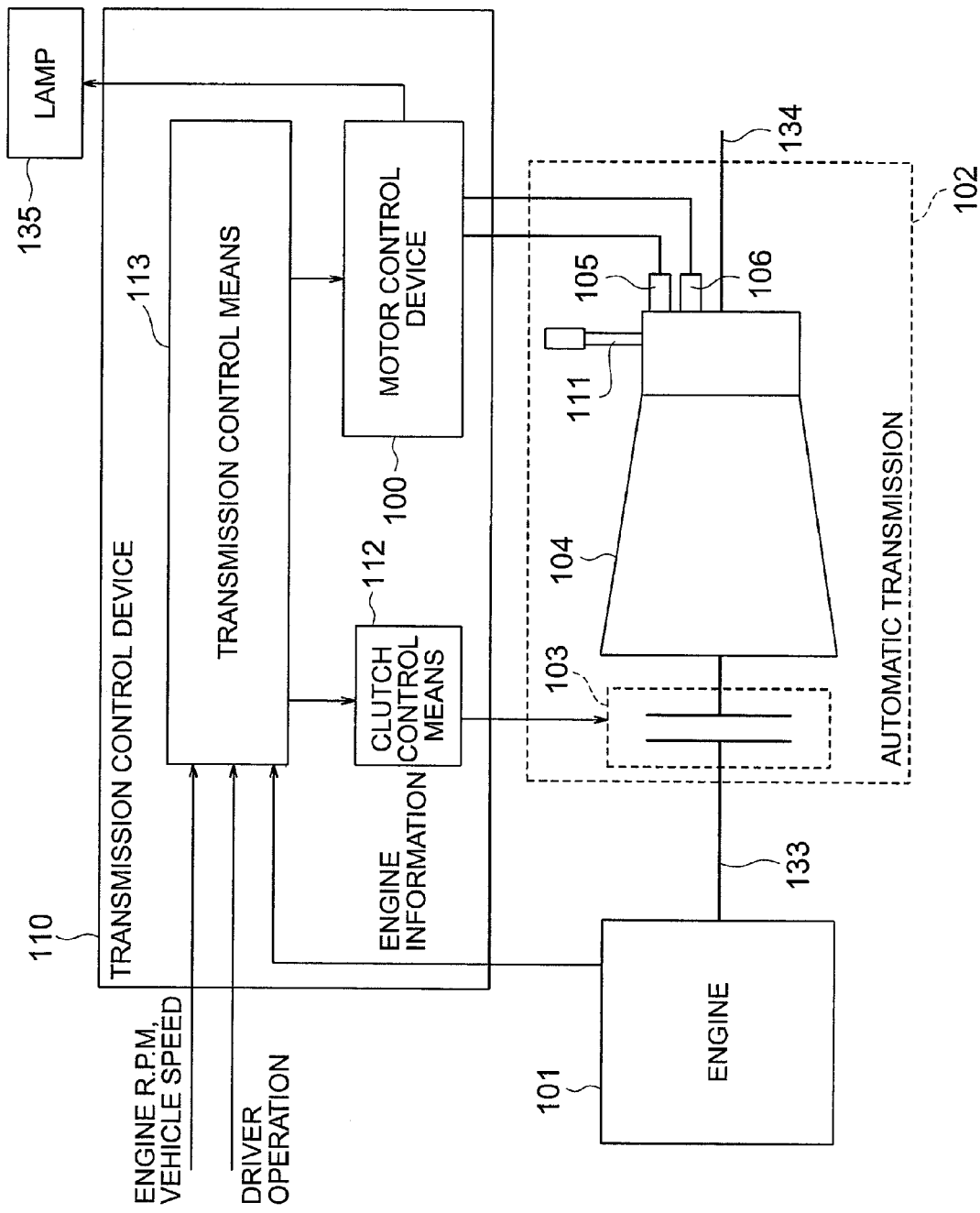
FIG. 1 is a diagram illustrating a configuration of a motor control device according to the present invention which is applied to a control device for a transmission.

FIG. 1 is a diagram illustrating a configuration of a motor control device according to the present invention which is applied to a transmission control device. Referring to FIG. 1, reference numeral 110 denotes the transmission control device; 101, an engine; and 102, an automatic transmission. In the following description, identical or corresponding parts are denoted by the same reference numerals and symbols in the respective drawings.

In the automatic transmission 102, reference numeral 103 denotes a clutch that is fixed to an input portion of the automatic transmission 102 for transmission of a power from the engine 101, and 104 denotes a transmission mechanism for changing gears of the automatic transmission 102. The automatic transmission 102 is an automatic manual transmission that changes the gears with the aid of an actuator unlike a manual transmission. The automatic transmission 102 is structured to change the gears by manipulating a gear shift lever 111 with the aid of a shift direction motor 105 and a select direction motor 106.

In the transmission control device 110, reference numeral 100 denotes the motor control device of the present invention which controls two motors, that is, the shift direction motor 105 and the select direction motor 106. Reference numeral 112 denotes clutch control means which controls engagement/disengagement of the clutch in response to an instruction from transmission control means 113. As an actuator for controlling the clutch, for example, a hydraulic control valve, a motor, or the like is used. The transmission control means 113 determines the gear based on information on a vehicle speed, engine R.P.M, or a driver operation signal such as an accelerator opening degree, and instructs the clutch control means 112 and the motor control device 100 to change the gear.

Reference numeral 133 is an input shaft that transmits the power to the automatic transmission 102 from the engine 101, and 134 denotes an output shaft that transmits the power to wheels from the automatic transmission 102. Reference numeral 135 denotes a lamp in the interior of a meter of a vehicle, and the lamp turns on according to fault information on the motor which is output by the motor control device 100.

Figure 2:
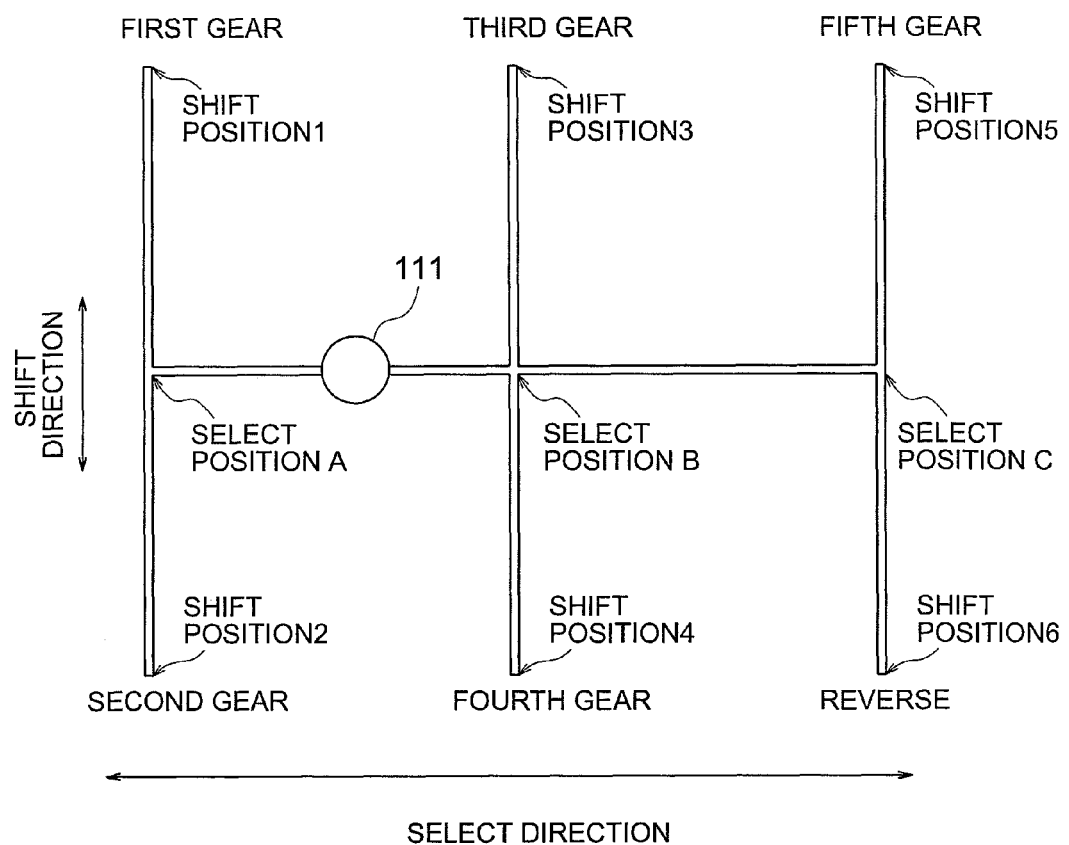
FIG. 2 is a diagram illustrating details of a gear shift lever of FIG. 1.

FIG. 2 illustrates details of the gear shift lever 111 illustrated in FIG. 1. The gear shift lever 111 is driven by the shift direction motor 105 and the select direction motor 106 illustrated in FIG. 1. The shift direction motor 105 is a motor that moves the gear shift lever 111 in a shift direction, and the select direction motor 106 is a motor that moves the gear shift lever 111 in a select direction.

When the gear shift lever 111 moves to a shift position 1, a first gear is engaged with the output shaft 134, and when the gear shift lever 111 moves to a shift position 2, a second gear is engaged with the output shaft 134. When the gear shift lever 111 moves to a shift position 3, a third gear is engaged with the output shaft 134, and when the gear shift lever 111 moves to a shift position 4, a fourth gear is engaged with the output shaft 134. When the gear shift lever 111 moves to a shift position 5, a fifth gear is engaged with the output shaft 134, and when the gear shift lever 111 moves to a shift position 6, a reverse gear is engaged with the output shaft 134. Further, when the gear shift lever 111 moves to a select position A, a select position B, or a select position C, the transmission comes into a neutral state in which none of the gears is engaged with the output shaft 134.

Figure 3:
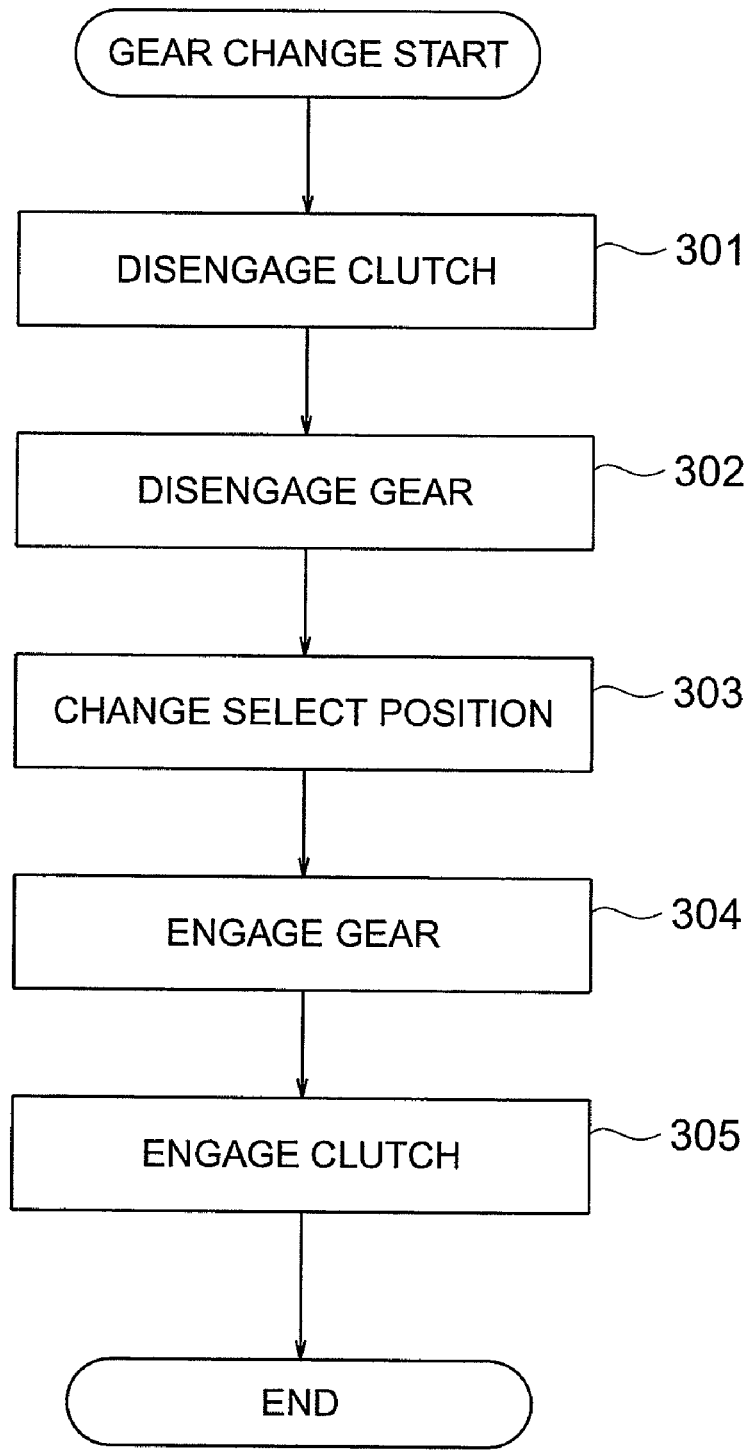
FIG. 3 is a flowchart illustrating an operation flow of the transmission in the case of changing a gear from a second gear to a third gear during travel.

FIG. 3 is a flowchart illustrating an operation flow of the transmission in the case of changing the gear from the second gear to the third gear during travel. During travel with the second gear, the gear shift lever 111 is at the shift position 2. In Step 301, in order to change the gear, the clutch 103 is disengaged by the clutch control means 112 (a state in which the input shaft 133 and the output shaft 134 are not coupled with each other). In Step 302, the gear shift lever 111 that is at the shift position 2 is moved to the select position A by means of the shift direction motor 105. When the gear shift lever 111 moves to the select position A, the first gear is disengaged (a state in which the first gear is disengaged with the output shaft 134), and the transmission comes into the neutral state.

In Step 303, the gear shift lever 111 is moved to the select position B by means of the select direction motor 106. In Step 304, the gear shift lever 111 is moved to the shift position 3 by means of the shift direction motor 105. When the gear shift lever 111 moves to the shift position 3, the third gear (not shown) is engaged with the output shaft 134, whereby the gear is changed to the third gear. In Step 305, when the clutch 103 is engaged by the clutch control means 112 (a state in which the input shaft 133 and the output shaft 134 are coupled with each other), a gear changing operation is terminated.

Figure 4:
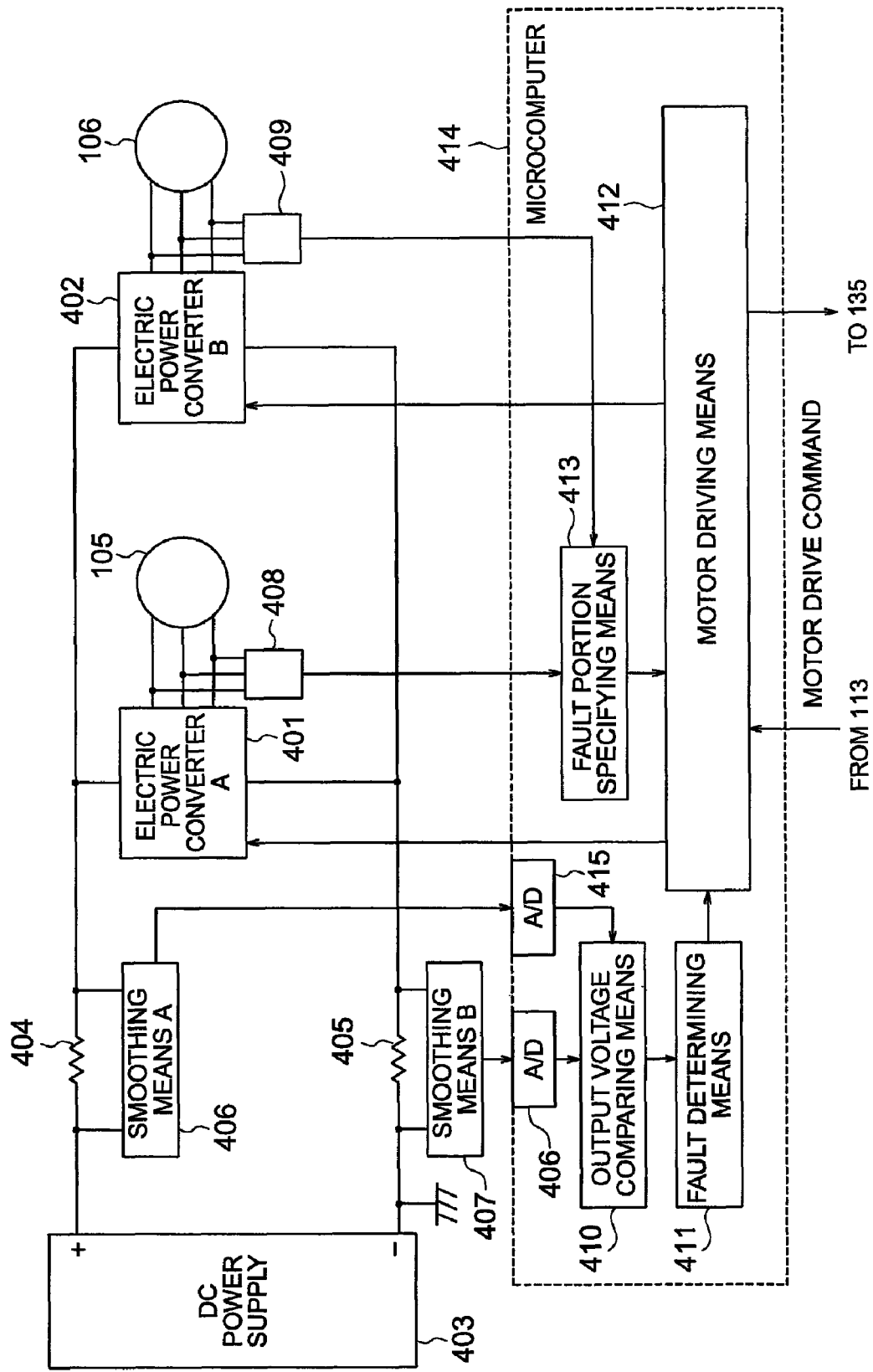
FIG. 4 is a diagram illustrating the configuration of a motor control device according to a first embodiment of the present invention.

FIG. 4 is a diagram illustrating a configuration of the motor control device according to a first embodiment of the present invention. In FIG. 4, the shift direction motor 105 and the select direction motor 106 correspond to those illustrated in FIG. 1. Reference numeral 401 denotes an electric power converter A for driving the shift direction motor 105, and 402 denotes an electric power converter B for driving the select direction motor 106. Reference numeral 403 denotes a DC power supply for supplying an electric power to the electric power converter A 401 and the electric power converter B 402.

The DC power supply 403 feeds power to the electric power converter A 401 and the electric power converter B 402 which are connected to the DC power supply 403 in parallel, respectively, in order to feed power to the shift direction motor 105 and the select direction motor 106. The electric power converter A 401 and the electric power converter B 402 subject the electric power from the DC power supply 403 to electric power conversion to drive the shift direction motor 105 and the select direction motor 106, respectively.

Reference numeral 404 denotes a current detection resistor A that is connected between a point which is connected with a DC bus line at a positive terminal side of the electric power converter A 401 and the electric power converter B 402, and a positive terminal (+) of the DC power supply 403. Reference numeral 405 denotes a current detection resistor B that is connected between a point which is connected with a DC bus line at a negative terminal side of the electric power converter A 401 and the electric power converter B 402, and a negative terminal (−) of the DC power supply 403. Reference numeral 406 denotes smoothing means A that smoothes a voltage developed in the current detection resistor A 404. Reference numeral 407 denotes smoothing means B that smoothes a voltage developed in the current detection resistor B 405.

Each of the smoothing means A 406 and the smoothing means B 407 is constituted by, for example, an RC circuit using a resistor and a capacitor. Reference numeral 408 denotes terminal voltage measuring means A for measuring a terminal voltage of the shift direction motor 105 on the basis of a ground (negative terminal of the DC power supply), and reference numeral 409 is terminal voltage measuring means B for measuring a terminal voltage of the select direction motor 106 on the basis of the ground (negative terminal of the DC power supply).

Reference numeral 414 denotes a microcomputer, and in the microcomputer 414, reference numeral 415 is A/D converting means A for subjecting an output of the smoothing means A 406 to A/D conversion, and 416 denotes A/D converting means B for subjecting an output of the smoothing means B 407 to A/D conversion. The A/D converting means A 415 and B 416 may be constituted separately from the microcomputer.

Reference numeral 410 denotes output voltage comparing means which compares the outputs of the smoothing means A 406 and the smoothing means B 407 with each other. Reference numeral 411 denotes fault determining means which determines whether or not a fault occurs based on an output of the output voltage comparing means 410. Reference numeral 412 is motor driving means which receives a drive command of the motor from the transmission control means 113 illustrated in FIG. 1 to thereby operate the electric power converter A 401 and the electric power converter B 402. Further, when the fault determining means 411 determines that a fault occurs, the motor driving means 412 outputs a control signal so as to turn off all of switching elements in the electric power converter A 401 and the electric power converter B 402 for control.

Reference numeral 413 denotes fault portion specifying means which determines which portion is at fault based on outputs of the terminal voltage measuring means A 408 and the terminal voltage measuring means B 409. The motor driving means 412 gives an instruction to stop the motor for a fault portion according to the fault portion specified by the fault portion specifying means 413. The microcomputer 414 implements processing of the output voltage comparing means 410, the fault determining means 411, the motor driving means 412, and the fault portion specifying means 413. The output voltage comparing means 410, the fault determining means 411, and the fault portion specifying means 413 constitute fault detecting means.

Figure 5:
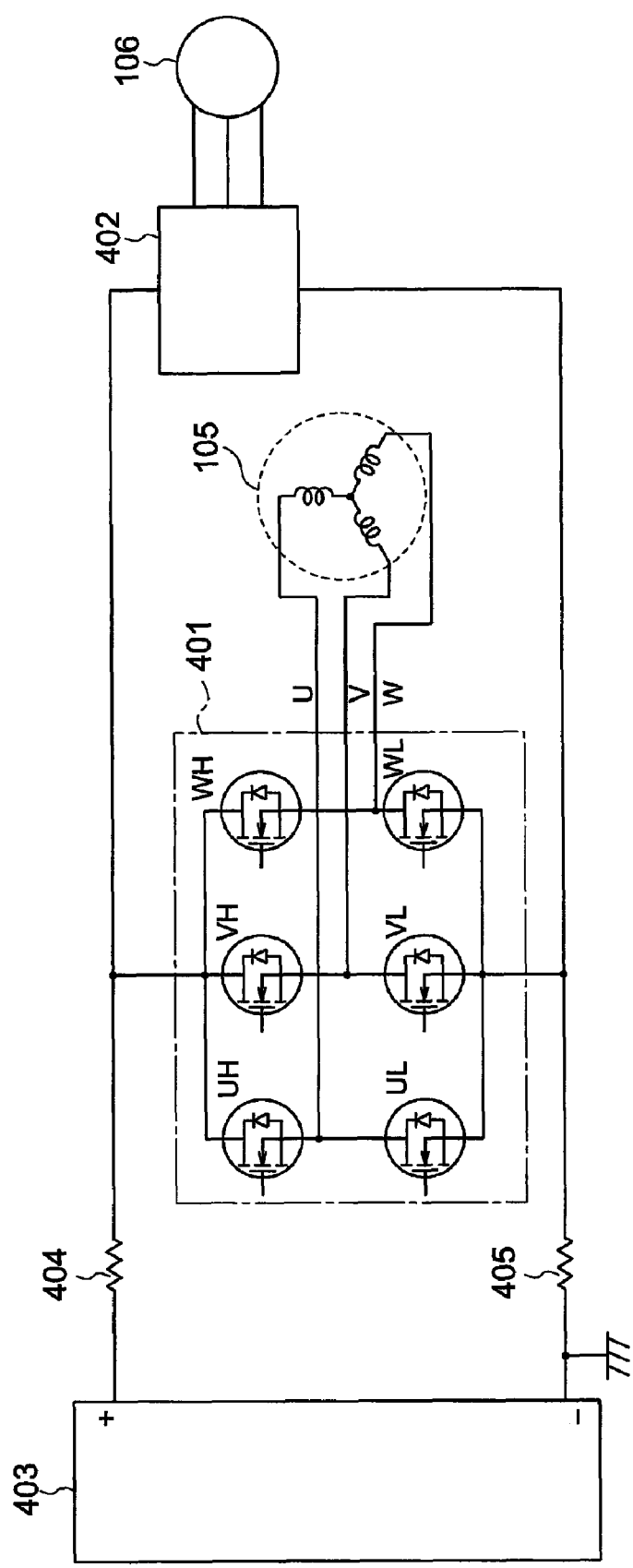
FIG. 5 is a diagram illustrating a detail of one electric power converter of FIG. 4.

FIG. 5 is a diagram illustrating a configuration of the electric power converter A 401 in detail. The electric power converter A 401 is made up of six switching elements of UH, UL, VH, VL, WH, and WL. Each of the switching elements is made up of, for example, an insulated gate bipolar transistor (IGBT). Further, output terminals U, V, and W of the electric power converter A 401 are connected to terminals U, V, and W of the shift direction motor 105, respectively.

For example, when a current flows from the terminal U to the terminal V of the motor, the switching element UH of an upper arm and the switching element VL of a lower arm are turned on, and other switching elements are turned off. An on/off ratio (drive duty) of the switching element UH changes due to pulse width modulation (PWM) drive, whereby an amount of the current that flows from the terminal U to the terminal V changes.

When the switching element UH of the electric power converter A 401 is turned on due to the PWM drive, a current flows from the DC power supply 403 into the current detection resistor A 404, the switching element UH, the motor terminal U, a motor coil, the motor terminal V, the switching element VL, the current detection resistor B 405, and the DC power supply 403 in the stated order. Further, when the switching element UH of the electric power converter A 401 is turned off due to the PWM drive, a current flows along a route of the motor terminal U, the motor coil, the motor terminal V, the switching element VL, the switching element UL (diode portion), and the motor terminal U.

Figure 6A:
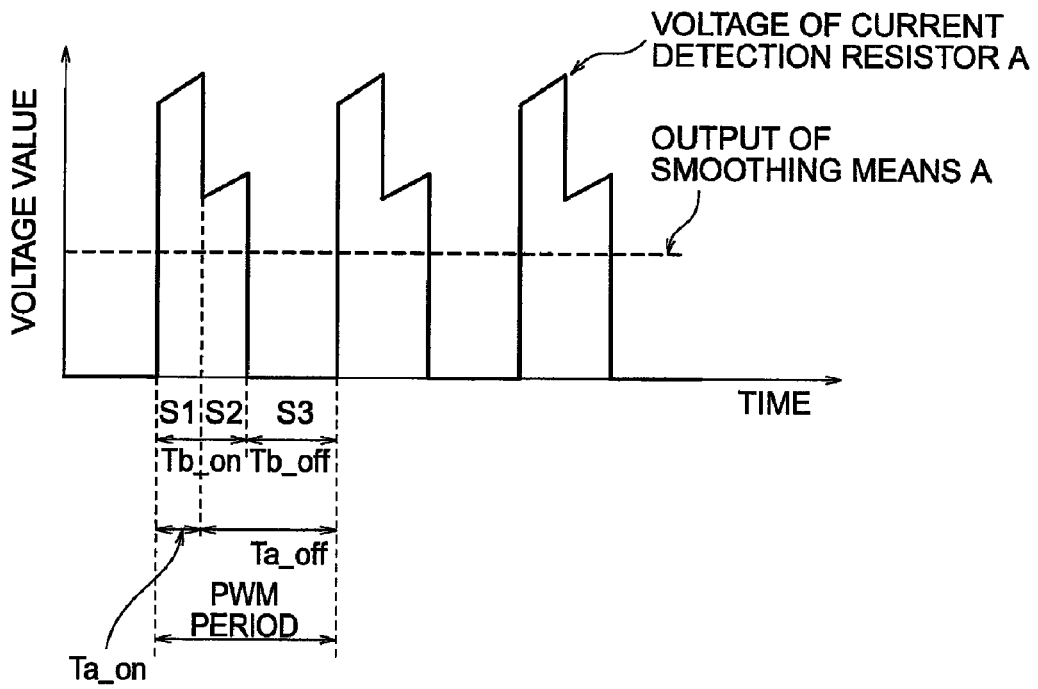
FIGS. 6A and 6B are graphs showing voltages of respective current detection resistors and smoothing means when no short circuit fault occurs in the device of FIG. 4, respectively.
Figure 6B:
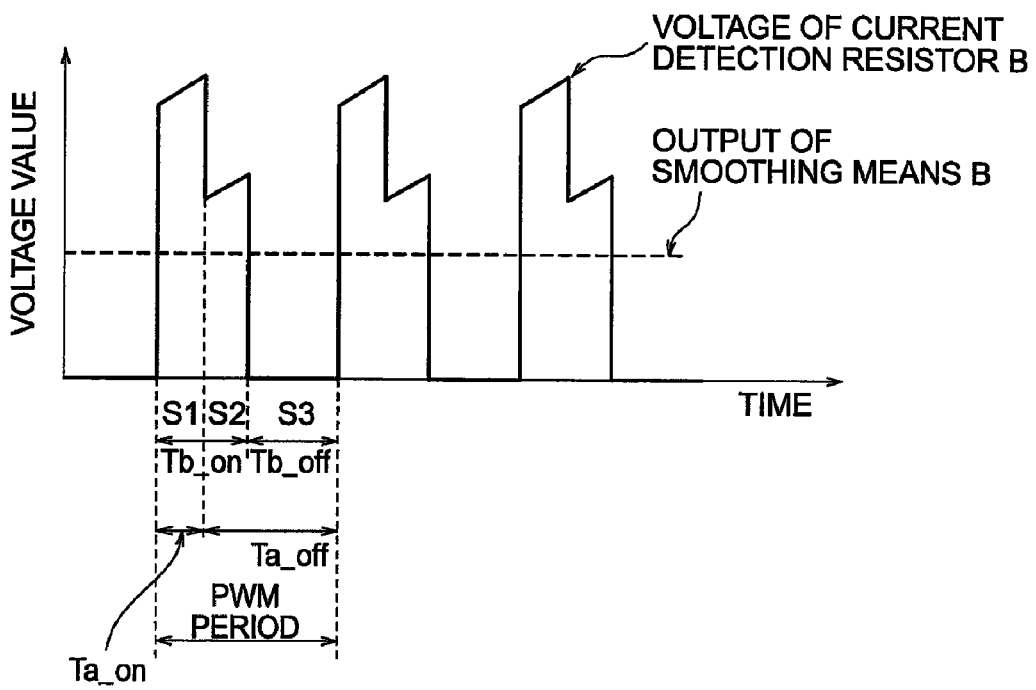

FIGS. 6A and 6B are a graph showing a voltage of the current detection resistor A 404 and an output voltage of the smoothing means A 406 and a graph showing a voltage of the current detection resistor B 405 and an output voltage of the smoothing means B 407, respectively, when no short circuit fault occurs. In FIGS. 6A and 6B and other figures, "Ta_on" expresses an on-period of the switching elements of the upper arm of the electric power converter A, "Ta_off" expresses an off-period of the switching elements of the upper arm of the electric power converter A, "Tb_on" expresses an on-period of the switching elements of the upper arm of the electric power converter B, "Tb_off" expresses an off-period of the switching elements of the upper arm of the electric power converter B, and a PWM period is a pulse width modulation period.

FIG. 6A shows the voltage of the current detection resistor A 404 and the output voltage of the smoothing means A 406. In the current detection resistor A 404, there flows a current obtained by adding a current that flows into the electric power converter A 401 from the DC power supply 403 and a current that flows into the electric power converter B 402 from the DC power supply 403. When the switching element (for example, UH) of the upper arm of the electric power converter A 401 is turned on, a current flows into the electric power converter A 401 from the DC power supply 403. When the switching element of the upper arm of the electric power converter B 402 is turned on, a current flows into the electric power converter B 402 from the DC power supply 403.

That is, when both of the switching element of the upper arm of the electric power converter A 401 and the switching element of the upper arm of the electric power converter B 402 are on, a current obtained by adding the current that flows into the electric power converter A 401 from the DC power supply 403 and the current that flows into the electric power converter B 402 from the DC power supply 403 flows into the current detection resistor A 404 (section S1 of FIG. 6A).

When the switching element of the upper arm of the electric power converter A 401 is turned off, and the switching element of the upper arm of the electric power converter B 402 is turned on, the current that flows into the electric power converter B 402 from the DC power supply 403 flows in the current detection resistor A 404 (section S2 of FIG. 6A).

Although not shown in FIGS. 6A and 6B, when the switching element of the upper arm of the electric power converter A 401 is turned on, and the switching element of the upper arm of the electric power converter B 402 is turned off, the current that flows into the electric power converter A 401 from the DC power supply 403 flows in the current detection resistor A 404. When both of the switching elements of the upper arms of the electric power converter A 401 and the electric power converter B 402 are off, no current flows into the electric power converter A 401 and the electric power converter B 402 from the DC power supply 403. As a result, no current flows in the current detection resistor A 404 either (section S3 of FIG. 6A).

A voltage is developed in the current detection resistor A 404 according to the current flowing in the current detection resistor A 404, and thus a voltage is developed in synchronism with an on-timing of the switching elements of the upper arms of the electric power converter A 401 and the electric power converter B 402. That is, when the switching element of the upper arm of any one of the electric power converter A 401 and the electric power converter B 402 is turned on, a voltage is developed according to the current flowing in the current detection resistor A 404. When all of the switching elements of the upper arms of the electric power converter A 401 and the electric power converter B 402 are off, no voltage is developed, to be 0 [V]. The smoothing means A 406 determines a time constant so as to smooth a voltage fluctuation caused by an on/off operation of the switching element of the upper arm of the electric power converter A 401 or the electric power converter B 402.

FIG. 6B shows the voltage of the current detection resistor B 405 and the output voltage of the smoothing means B 407. In the current detection resistor B 405, there flows a current obtained by adding a current that flows into the negative terminal (ground) of the DC power supply 403 from the DC power supply 403 through the electric power converter A 401 and a current that flows into the negative terminal of the DC power supply 403 from the DC power supply 403 through the electric power converter B 402. A timing at which the current flows into the electric power converter A 401 and the electric power converter B 402 from the DC power supply 403 is the on-timing of the switching elements of the upper arms of the electric power converter A 401 and the electric power converter B 402. For that reason, a current flows in the current detection resistor B 405 in synchronism with the on-timing of the switching elements of the upper arms of the electric power converter A 401 and the electric power converter B 402. As a result, a voltage is developed therein according to the current.

The smoothing means B 407 determines a time constant so as to smooth a voltage fluctuation caused by the on/off operation of the switching element of the upper arm of the electric power converter A 401 or the electric power converter B 402. In this way, when no fault occurs, a current that flows in the current detection resistor A 404 and a current that flows in the current detection resistor B 405 are identical with each other. From this fact, the following relationship is met between the smoothing means A 406 and the smoothing means B 407 when no fault occurs.

(Output voltage of smoothing means $A$)=(Output voltage of smoothing means $B$)

Figure 7A:
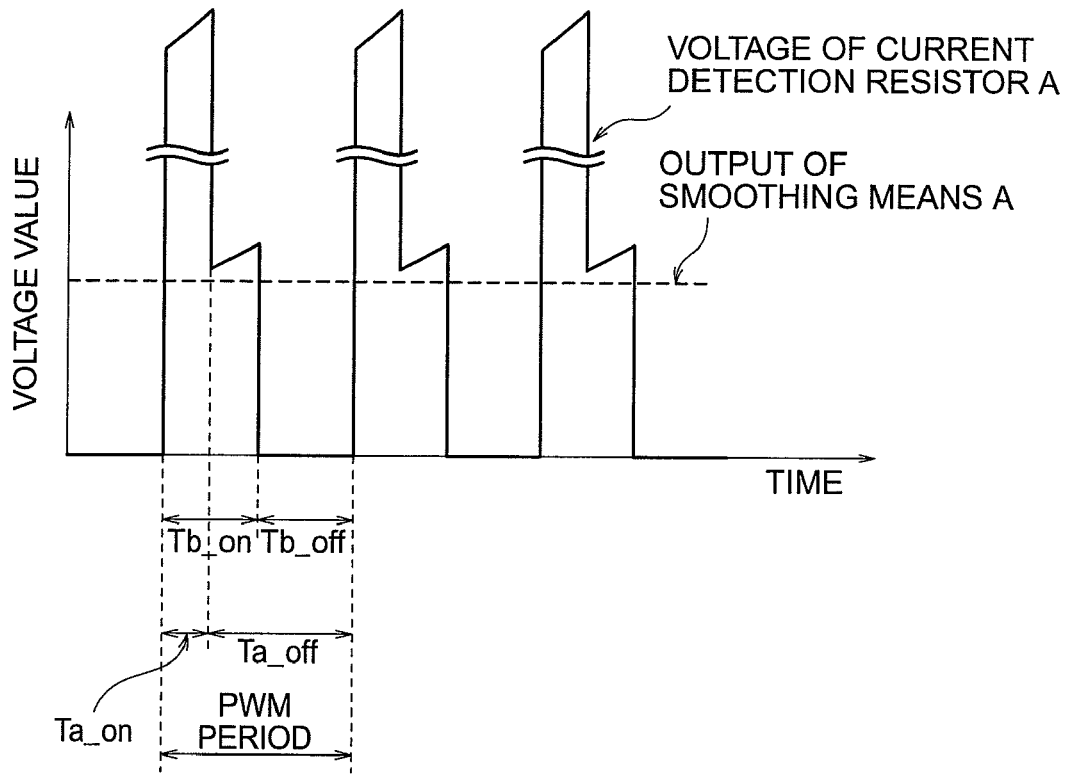
FIGS. 7A and 7B are graphs showing the voltages of the respective current detection resistors and the smoothing means when ground short circuit occurs in the device of FIG. 4, respectively.
Figure 7B:
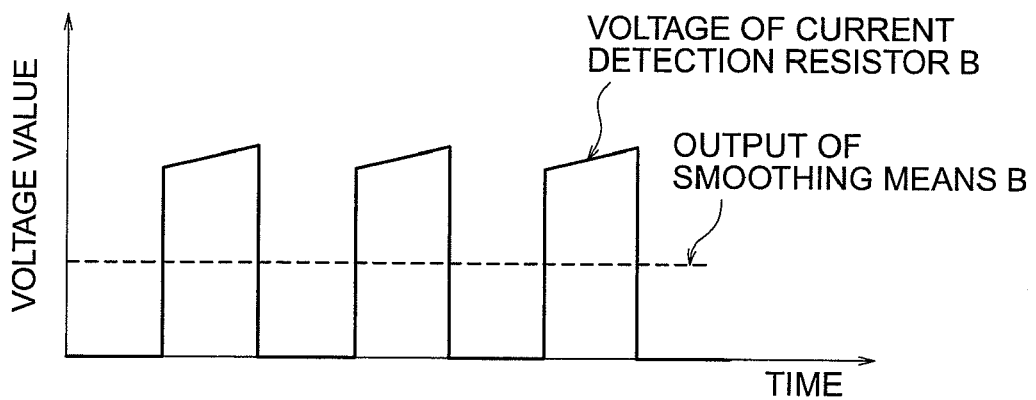

FIGS. 7A and 7B show outputs of the current detection resistor A 404 and the current detection resistor B 405 and outputs of the smoothing means A 406 and the smoothing means B 407, respectively, when the terminal U of the electric power converter A 401 is short-circuited to ground in a state in which the electric power converter A 401 is energized from the terminal U to the terminal V.

FIG. 7A shows a voltage of the current detection resistor A 404 and an output voltage of the smoothing means A 406. When the terminal U of the electric power converter A 401 is short-circuited to ground, at a timing at which the switching element UH of the electric power converter A 401 is turned on, a current flows along a route of the DC power supply 403, the current detection resistor A 404, the switching element UH, and the short-circuited ground. In the route, no current flows in the motor, and hence an impedance becomes small, a large current flows, and a voltage of the current detection resistor A 404 becomes also large. Further, when the switching element UH of the electric power converter A 401 is turned off, no current flows. With the above-mentioned operation, the output voltage of the smoothing means A 406 increases with respect to the output voltage thereof when no fault occurs.

As described above, when a ground short circuit fault occurs in one motor among a plurality of motors, a current in the current detection resistor A 404 becomes large. An overcurrent is detected from that current value, thereby enabling the ground short circuit among the plurality of motors to be detected.

FIG. 7B shows a voltage of the current detection resistor B 405 and an output voltage of the smoothing means B 407. When ground short circuit occurs in the electric power converter A 401, the current that flows into the electric power converter A 401 from the DC power supply 403 flows in the short-circuited ground. For that reason, a current flowing into the negative terminal of the DC power supply 403 from the DC power supply 403 through the electric power converter A 401 does not flow in the current detection resistor B 405, and only a current flowing into the negative terminal of the DC power supply 403 from the DC power supply 403 through the electric power converter B 402 flows in the current detection resistor B 405. For that reason, only a voltage synchronous with a timing at which the switching element of the electric power converter B 402 turns on is developed in the current detection resistor B 405. With the above-mentioned operation, the output voltage of the smoothing means B 407 becomes smaller with respect to the output voltage thereof when no fault occurs. From the above, when ground short circuit occurs, the following relationship is satisfied.

(Output voltage of smoothing means $A$)>(Output voltage of smoothing means $B$)

Using this characteristic, the ground short circuit is detected.

The short circuit is thus detected with the aid of a smoothing value, thereby making it unnecessary to implement A/D conversion in synchronism with the on-timing of the switching element, and accordingly making it possible to provide a motor control device with an inexpensive configuration which can be configured by a microcomputer with no high-precision timer.

Figure 8A:
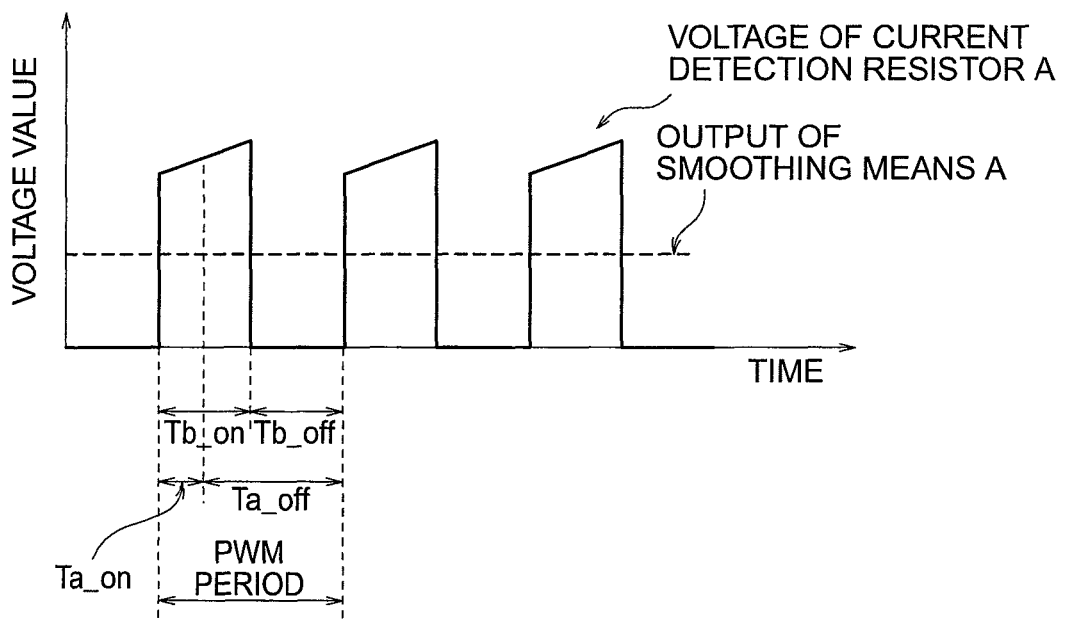
FIGS. 8A and 8B are graphs showing the voltages of the respective current detection resistors and the smoothing means when power supply short circuit occurs in the device of FIG. 4, respectively.
Figure 8B:
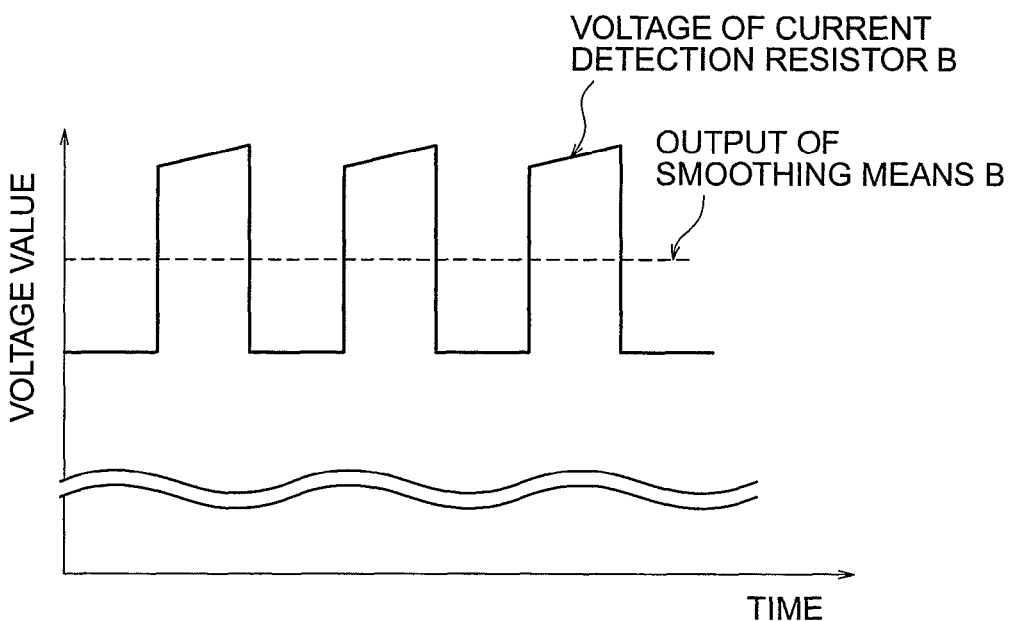

FIGS. 8A and 8B show outputs of the current detection resistor A 404 and the smoothing means A 406 and outputs of the current detection resistor B 405 and the smoothing means B 407, respectively, when the terminal V is short-circuited to the power supply in a state in which the electric power converter A 401 is energized from the terminal U to the terminal V.

FIG. 8A shows the voltage of the current detection resistor A 404 and the output voltage of the smoothing means A 406. In the case where power supply short circuit occurs in the terminal V of the electric power converter A 401, even when the switching element UH is turned on, a potential of the terminal V of the electric power converter A 401 and a potential of the DC power supply 403 are substantially identical with each other, whereby a current that flows into the electric power converter A 401 from the DC power supply 403 through the current detection resistor A 404 is 0 [A]. From the above, a current that flows in the current detection resistor A 404 is only a current that flows into the electric power converter B 402 from the DC power supply 403. Further, the output voltage of the smoothing means A 406 is smaller than the output voltage thereof when no fault occurs.

FIG. 8B shows the voltage of the current detection resistor B 405 and the output voltage of the smoothing means B 407. When the terminal V of the electric power converter A 401 is short-circuited to the power supply, a current flows along a route of the short-circuited power supply, the switching element VL, the current detection resistor B 405, and the negative terminal of the DC power supply 403. Further, when energization is performed from the terminal U to the terminal V, the switching element VL is always turned on. As a result, a current flows in the current detection resistor B 405 regardless of the on/off operation of the switching element UH of the upper arm. For that reason, the voltage of the current detection resistor B 405 always maintains a high level. Further, the output of the smoothing means B 407 becomes smaller with respect to the voltage thereof when no fault occurs. From the above, when power supply short circuit occurs, the following relationship is satisfied.

(Output voltage of smoothing means $A$)>(Output voltage of smoothing means $B$)

Using this characteristic, the ground short circuit is detected.

With the above-mentioned configuration, for example, even when the number of motors increases, it is possible to detect the short circuit fault by means of two current detection resistors, and the motor control device can be configured inexpensively.

Figure 9:
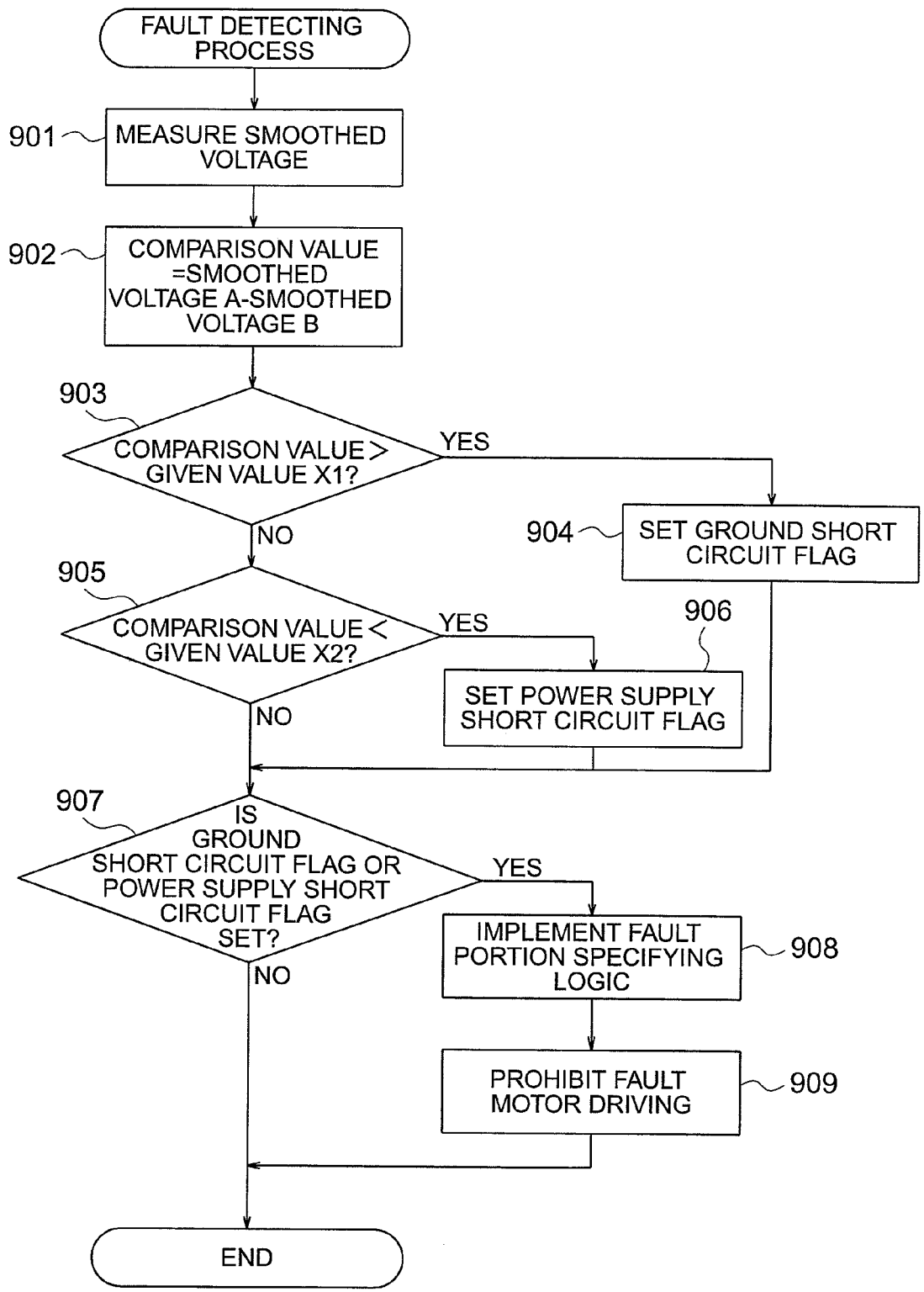
FIG. 9 is a flowchart illustrating an operation flow of the device illustrated in FIG. 4.

FIG. 9 is a flowchart illustrating an operation flow of the motor control device according to the first embodiment. In Step 901, the output of the smoothing means A 406 is sampled as a smoothed voltage A by the A/D converting means A 415. Further, the output of the smoothing means B 407 is sampled as a smoothed voltage B by the A/D converting means B 416. In Step 902, the following comparison value is calculated on the basis of the smoothed voltage A and the smoothed voltage B which have been sampled in Step 901 in the output voltage comparing means 410 (sampling control may be performed by the output voltage comparing means).

(Comparison value)=(Smoothed voltage *A*)−(Smoothed voltage *B*)

In Step 903, the comparison value calculated in Step 902 is compared with a given value X1 in the fault determining means 411, and when the comparison value is larger than the given value X1 (the given value X1 is a positive value), the output voltage of the smoothing means A 406 is larger than the output voltage of the smoothing means B 407, resulting in a status shown in FIGS. 7A and 7B. For that reason, it is determined that the ground short circuit occurs, and the processing is advanced to Step 904, and in other cases, the processing is advanced to Step 905. In step 904, because the ground short circuit occurs, a ground short circuit flag is set. Various flags are set within a memory (not shown) in the microcomputer 414.

In Step 905, when the comparison value is smaller than a given value X2 (the given value X2 is a negative value) in the fault determining means 411, the output voltage of the smoothing means A 406 is smaller than the output voltage of the smoothing means B 407, resulting in a status shown in FIGS. 8A and 8B. For that reason, it is determined that the power supply short circuit occurs, and the processing is advanced to Step 906. In other cases, the processing is advanced to Step 907. In Step 906, because the power supply short circuit occurs, a power supply short circuit flag is set.

In Step 907, it is confirmed whether or not the ground short circuit flag or the power supply short circuit flag is set in the fault determining means 411. When any flag is set, a fault occurs, and therefore the processing is advanced to Step 908. When none of those flags is set, because no fault occurs, the fault detecting process is terminated.

In Step 908, it is specified which motor of the electric power converter A 401 or the electric power converter B 402 is at fault, in the fault portion specifying means 413 that is described later. In Step 909, the switching element of the electric power converter A 401 or the electric power converter B 402 is turned off depending on the fault portion specified by the fault portion specifying means 413 in the motor driving means 412, thereby protecting a circuit while prohibiting driving. Further, the motor driving means 412 lights the lamp 135 to inform the driver of the fault.

Figure 10:
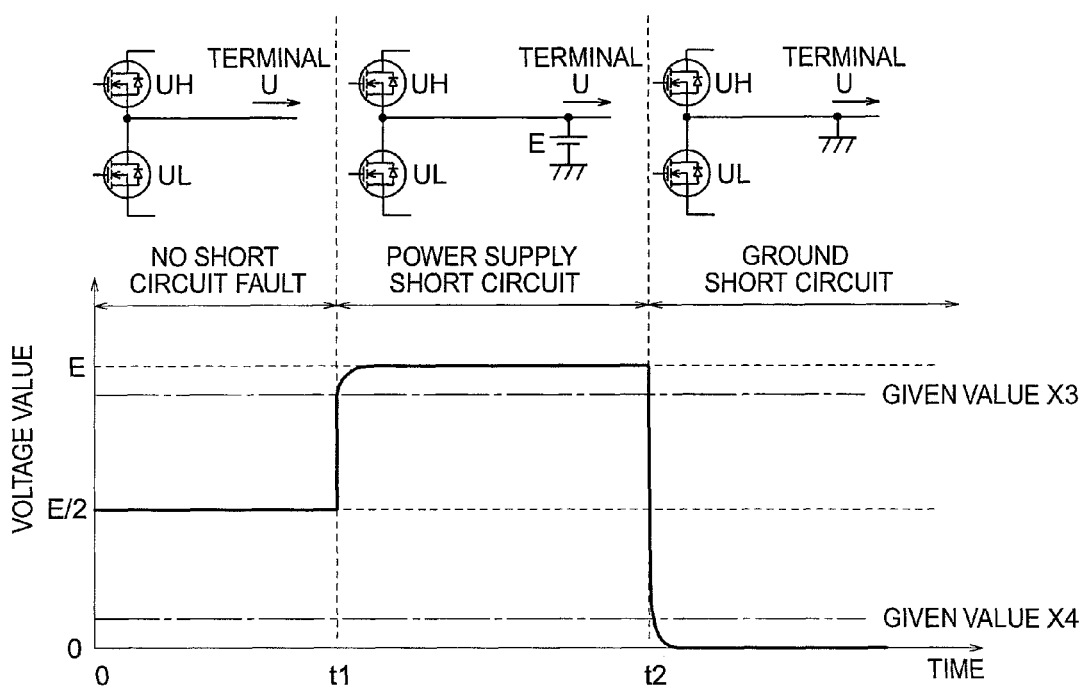
FIG. 10 is a diagram illustrating a terminal voltage when the ground short circuit and the power supply short circuit occur.

FIG. 10 is a timing chart illustrating a terminal voltage of the terminal U when the ground short circuit or the power supply short circuit occurs. At a time 0 to a time t1, none of the ground short circuit and the power supply short circuit occurs, and thus the terminal voltage of the terminal U is ½ of a voltage E of the DC power supply 403.

At the time t1 to a time t2, the terminal U is short-circuited to the power supply. In this case, the terminal voltage of the terminal U is a voltage value of the short-circuited power supply (in FIG. 10, it is assumed that the voltage of the short-circuited power supply is expressed by E). In the case of the power supply short circuit, the behavior as described above is observed. Therefore, a given value X3 is provided, and in the case where the terminal voltage when the switching element is turned off becomes equal to or larger than the given value X3, it is determined that the power supply short circuit occurs. The given value X3 can be set to a value which enables the determination that the terminal voltage rises up to about the power supply voltage E, for example, in a range of from 0.8 E to 0.95 E.

After the time t2, the terminal U is short-circuited to the ground. In this case, the terminal voltage of the terminal U is grounded, that is, 0V. When the ground short circuit occurs, the terminal voltage is 0V as described above, and thus a given value X4 is provided, whereby it is determined that the ground short circuit occurs when all of the switching elements are off, and the terminal voltage is equal to or smaller than the given value X4. The given value X4 can be set to a value that enables the determination that the terminal voltage drops down to about 0 V, for example, in a range of from 0.2 E to 0.05 E.

Figure 11:
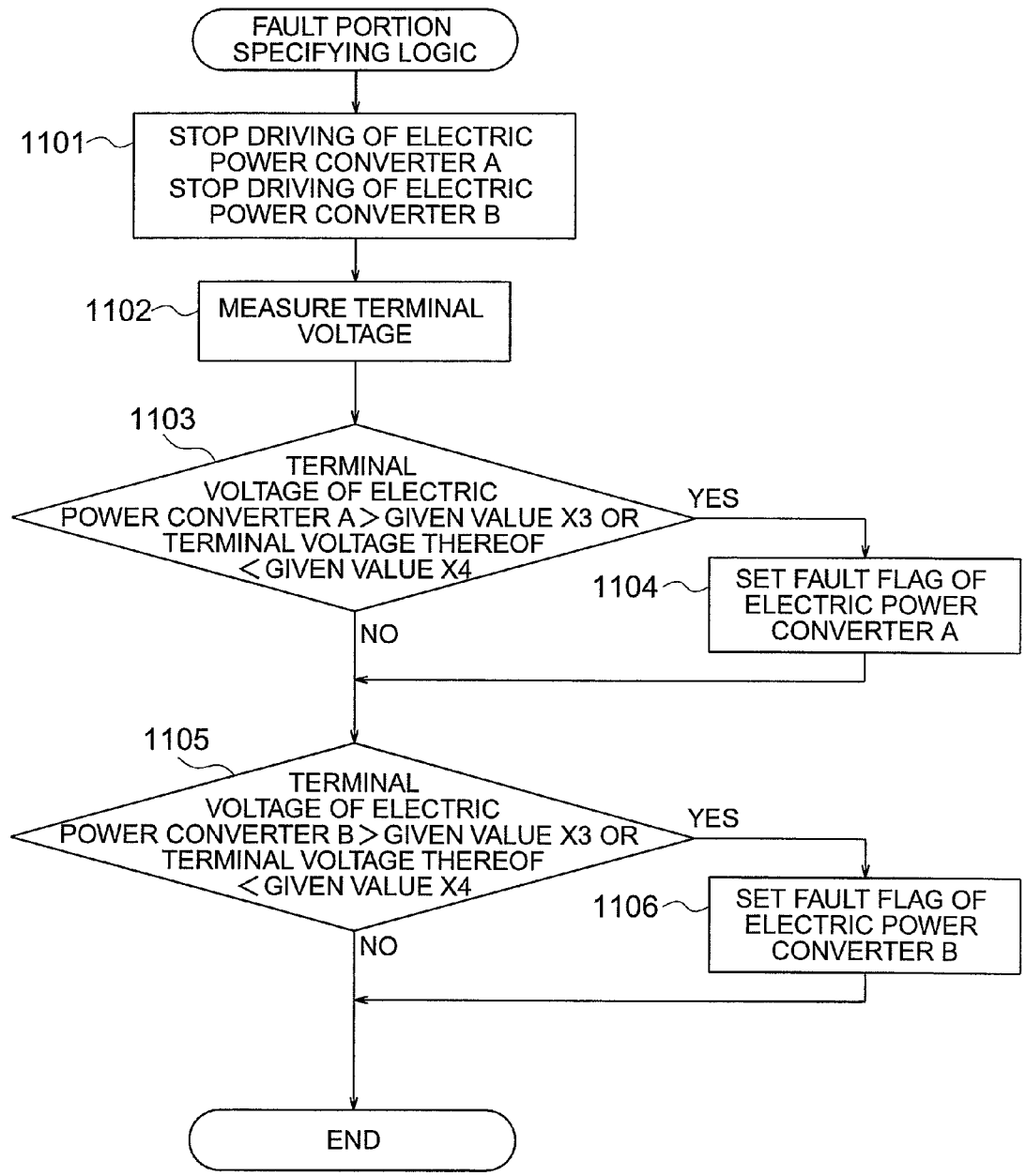
FIG. 11 is a flowchart illustrating a flow of a fault portion specifying logic in Step 908 of FIG. 9.

FIG. 11 is a flowchart illustrating a flow of a fault portion specifying logic implemented by the fault portion specifying means 413 in Step 908 of FIG. 9. In Step 1101, the motor driving means 412 is controlled to turn off all of the switching elements of the electric power converter A 401 and the electric power converter B 402. In Step 1102, measurement results of the terminal voltages of the terminal U, the terminal V, and the terminal W of the electric power converter A 401 are obtained from the terminal voltage measuring means A 408. Further, measurement results of the terminal voltages of the terminal U, the terminal V, and the terminal W of the electric power converter B 402 are obtained from the terminal voltage measuring means B 409.

In Step 1103, it is determined whether the terminal voltages of the terminal U, the terminal V, and the terminal W of the electric power converter A 401 which have been measured in Step 1102 are equal to or larger than the given value X3, or equal to or smaller than the given value X4, in the fault portion specifying means 413. When any one of the terminal voltages of the terminal U, the terminal V, and the terminal W is equal to or larger than the given value X3 or equal to or smaller than the given value X4, the processing is advanced to Step 1104, and in other cases, the processing is advanced to Step 1105. In Step 1104, the fault flag of the electric power converter A is set in the fault portion specifying means 413.

In Step 1105, it is determined whether the terminal voltages of the terminal U, the terminal V, and the terminal W of the electric power converter B 402 which have been measured in Step 1102 are equal to or larger than the given value X3, or equal to or smaller than the given value X4, in the fault portion specifying means 413. When any one of the terminal voltages of the terminal U, the terminal V, and the terminal W is equal to or larger than the given value X3 or equal to or smaller than the given value X4, the processing is advanced to Step 1106, and in other cases, the processing is terminated. In Step 1106, the fault flag of the electric power converter B is set in the fault portion specifying means 413.

As described above, when the fault is detected by those two current detection resistors, all the switching elements of the electric power converter A 401 and the electric power converter B 402 are turned off, and the terminal voltages are measured, thereby making it possible to detect which portion is at fault from the terminal voltages, resulting in an advantage that excessive labor is not required for specifying the fault portion.

Second Embodiment

Figure 12:
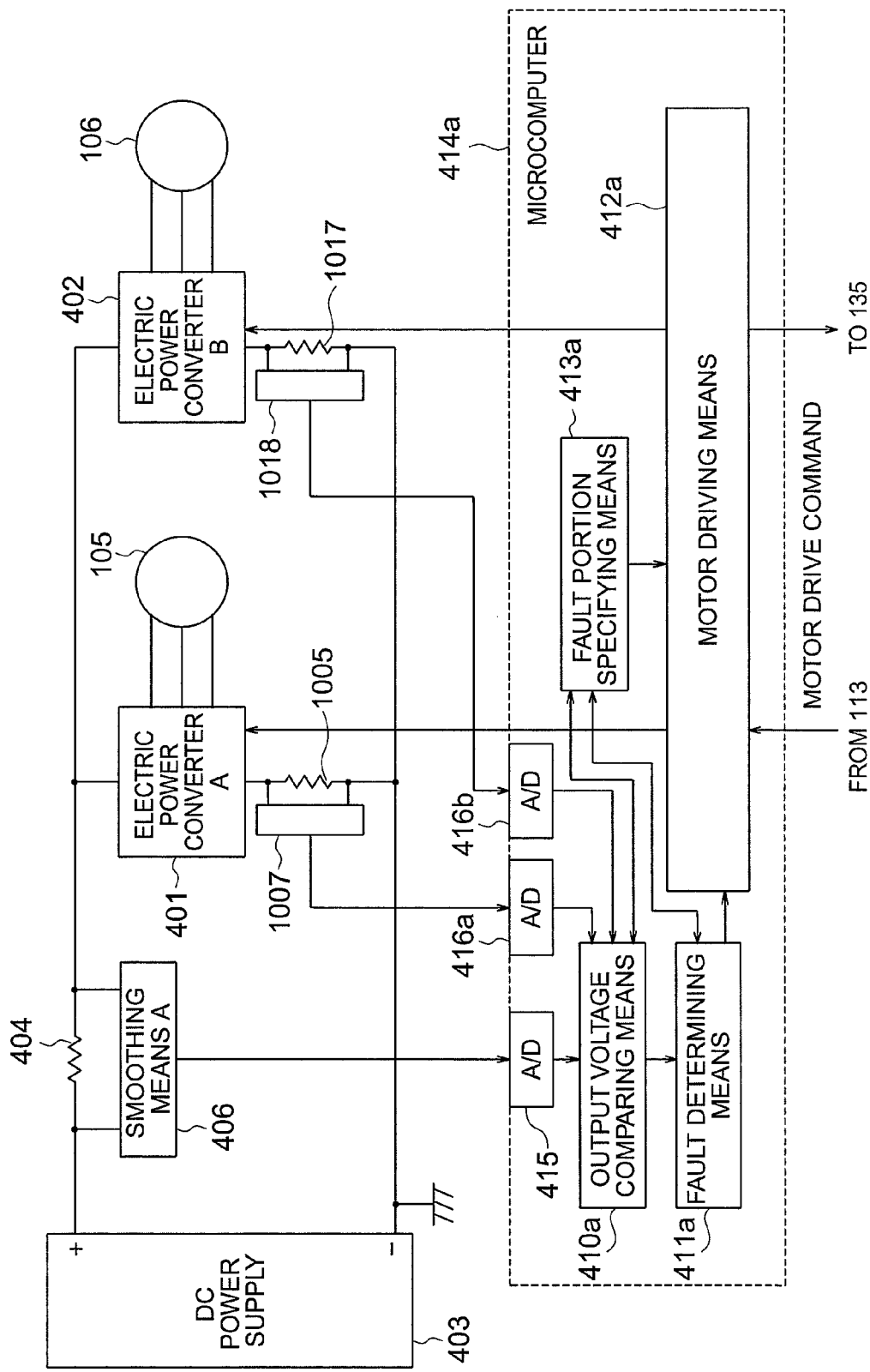
FIG. 12 is a diagram illustrating a configuration of a motor control device according to a second embodiment of the present invention.

FIG. 12 is a diagram illustrating the configuration of a motor control device according to a second embodiment of the present invention. The entire configuration is similar to the configuration illustrated in FIG. 4. In FIG. 12, parts identical with or corresponding to those of FIG. 4 are denoted by the same or like symbols, and their detailed description is omitted. Reference numeral 1005 denotes a current detection resistor B, which is connected between the electric power converter A 401 and a point to which the electric power converter A 401 and the electric power converter B 402 are connected on the negative terminal side. Reference numeral 1017 denotes a current detection resistor C, which is connected between the electric power converter B 402 and a point to which the electric power converter A 401 and the electric power converter B 402 are connected on the negative terminal side.

Reference numeral 1007 denotes smoothing means B that smoothes a voltage developed in the current detection resistor B 1005. Reference numeral 1018 denotes smoothing means C that smoothes a voltage developed in the current detection resistor C 1017. Each of the smoothing means 406, the smoothing means B 1007, and the smoothing means C 1018 is formed by, for example, an RC circuit using a resistor and a capacitor. Reference numeral 415 denotes A/D converting means A for subjecting the output of the smoothing means A 406 to A/D conversion, reference symbol 416a denotes A/D converting means B for subjecting the output of the smoothing means B 1007 to A/D conversion, and reference symbol 416b denotes A/D converting means C for subjecting the output of the smoothing means C 1018 to A/D conversion.

Reference symbol 410a denotes output voltage comparing means which compares the outputs of the smoothing means A 406, the smoothing means B 1007, and the smoothing means C 1018 with each other. Reference symbol 411a denotes fault determining means which determines whether or not a fault occurs, according to an output of the output voltage comparing means 410a. Reference symbol 412a denotes motor driving means that receives a drive instruction of the motor from the transmission control means 113 illustrated in FIG. 1 to operate the electric power converter A 401 and the electric power converter B 402. Further, when the fault determining means 411a determines that a fault occurs, the motor driving means 412a instructs to turn off all of switching elements of the electric power converter A 401 and the electric power converter B 402.

Reference symbol 413a denotes fault portion specifying means which specifies which motor or electric power converter is at fault by driving the plurality of motors one by one. The motor driving means 412a gives an instruction to stop the motor for the fault portion according to the fault portion specified by the fault portion specifying means 413a. Reference symbol 414a denotes a microcomputer that implements the processing of the output voltage comparing means 410a, the fault determining means 411a, and the fault portion specifying means 413a. The output voltage comparing means 410a, the fault determining means 411a, and the fault portion specifying means 413a form the fault detecting means.

Figure 13A:
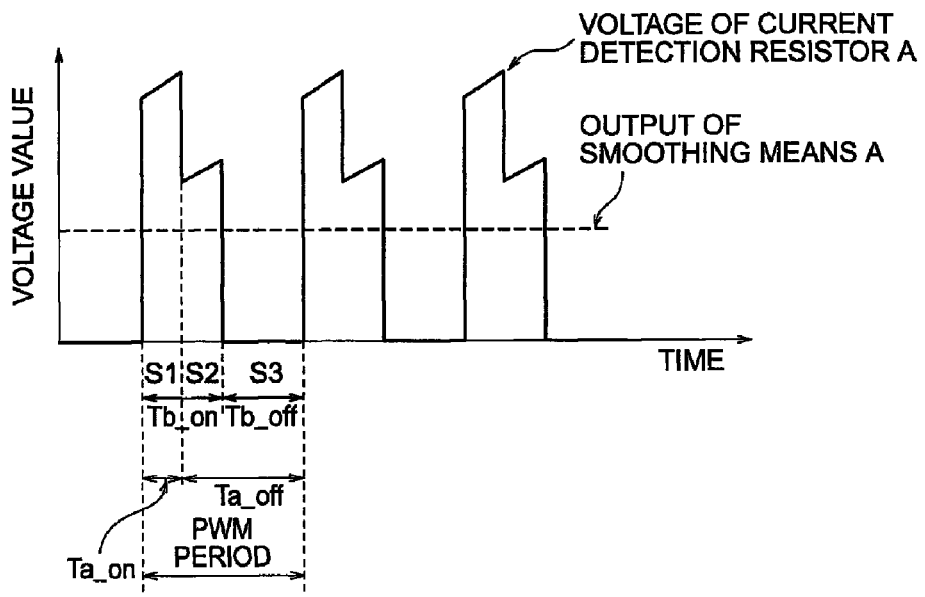
FIGS. 13A, 13B, and 13C are graphs showing voltages of respective current detection resistors and smoothing means when no short circuit fault occurs in the device of FIG. 12, respectively.
Figure 13B:
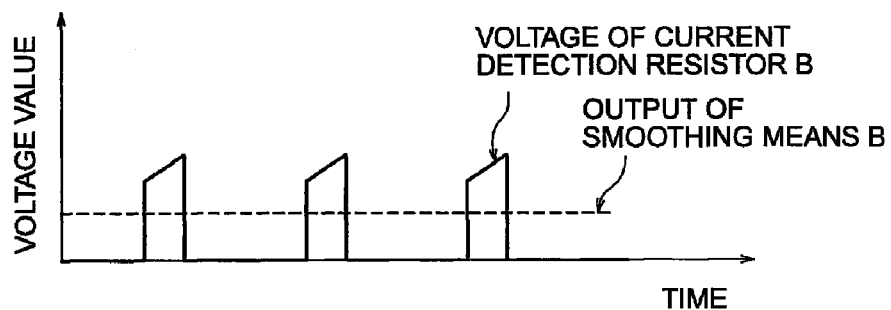
Figure 13C:
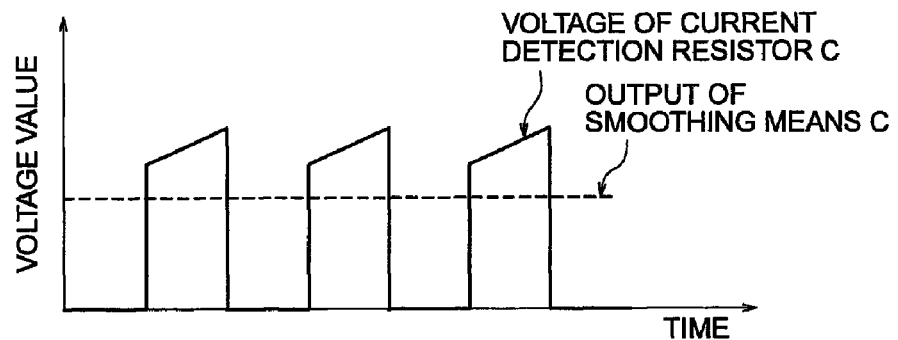

FIGS. 13A, 13B, and 13C are graphs showing a voltage of the current detection resistor A 404 and an output voltage of the smoothing means A 406, a voltage of the current detection resistor B 1005 and an output voltage of the smoothing means B 1007, and a voltage of the current detection resistor C 1017 and an output voltage of the smoothing means 1018 when no short circuit fault occurs.

FIG. 13A shows a voltage of the current detection resistor A 404 and the output of the smoothing means A 406. In the current detection resistor A 404, a current obtained by adding a current flowing into the electric power converter A 401 from the DC power supply 403 and a current flowing into the electric power converter B 402 from the DC power supply 403 flows. When the switching element (for example, UH) of the upper arm of the electric power converter A 401 is turned on, a current flows into the electric power converter A 401 from the DC power supply 403. When the switching element of the upper arm of the electric power converter B 402 is turned on, a current flows into the electric power converter B 402 from the DC power supply 403.

That is, when both of the switching element of the upper arm of the electric power converter A 401 and the switching element of the electric power converter B 402 are on, a current obtained by adding the current that flows into the electric power converter A 401 from the DC power supply 403 and the current that flows into the electric power converter B 402 from the DC power supply 403 flows in the current detection resistor A 404 (section S1 of FIG. 13A).

When the switching element of the electric power converter A 401 is turned off, and the switching element of the upper arm of the electric power converter B 402 is turned on, the current that flows into the electric power converter B 402 from the DC power supply 403 flows into the current detection resistor A 404 (section S2 of FIG. 13A).

Although not shown in FIGS. 13A, 13B, and 13C, when the switching element of the upper arm of the electric power converter A 401 is turned on, and the switching element of the upper arm of the electric power converter B 402 is turned off, the current that flows into the electric power converter A 401 from the DC power supply 403 flows into the current detection resistor A 404. When both of the switching elements of the upper arms of the electric power converter A 401 and the electric power converter B 402 are off, no current flows into the electric power converter A 401 and the electric power converter B 402 from the DC power supply 403. As a result, no current flows in the current detection resistor A 404 either (section S3 of FIG. 13A).

A voltage is developed in the current detection resistor A 404 according to the current flowing in the current detection resistor A 404, and thus a voltage is developed in synchronism with the on-timing of the switching elements of the upper arms of the electric power converter A 401 and the electric power converter B 402. That is, when the switching element of the upper arm of any one of the electric power converter A 401 and the electric power converter B 402 is turned on, a voltage is developed according to the current flowing in the current detection resistor A 404. When all of the switching elements of the upper arms of the electric power converter A 401 and the electric power converter B 402 are off, no voltage is developed, to be 0 M. The smoothing means A 406 determines a time constant so as to smooth a voltage fluctuation caused by the on/off operation of the switching element of the upper arm of the electric power converter A 401 or the electric power converter B 402.

FIG. 13B shows the voltage of the current detection resistor B 1005 and the output voltage of the smoothing means B 1007. A current that flows into the negative terminal of the DC power supply 403 from the DC power supply 403 through the electric power converter A 401 flows in the current detection resistor B 1005. That is, the current flows in the current detection resistor B 1005 during only a period of time when the switching element of the upper arm which PWM-drives the electric power converter A 401 is turned on. For that reason, a voltage is developed in the current detection resistor B 1005 in synchronism with on-time of the switching element of the upper arm of the electric power converter A 401. In a period of time when the switching element of the upper arm of the electric power converter A 401 is turned off, no current flows in the current detection resistor B 1005, and the voltage of the current detection resistor B 1005 is also 0 [V]. In the smoothing means B 1007, a time constant is determined so as to smooth the voltage fluctuation caused by the on/off operation of the switching element of the upper arm of the electric power converter A 401.

FIG. 13C shows the voltage of the current detection resistor C 1017 and the output voltage of the smoothing means C 1018. A current that flows into the negative terminal of the DC power supply 403 from the DC power supply 403 through the electric power converter B 402 flows in the current detection resistor C 1017. That is, the current flows in the current detection resistor C 1017 during only a period of time when the switching element of the upper arm which PWM-drives the electric power converter B 402 is turned on. For that reason, a voltage is developed in the current detection resistor C 1017 in synchronism with on-time of the switching element of the upper arm of the electric power converter B 402. In a period of time when the switching element of the upper arm of the electric power converter B 402 is turned off, no current flows in the current detection resistor C 1017, and the voltage of the current detection resistor C 1017 is also 0 [V]. In the smoothing means C 1018, a time constant is determined so as to smooth the voltage fluctuation caused by the on/off operation of the switching element of the upper arm of the electric power converter B 402.

When no short circuit fault occurs, a value of current that flows in the current detection resistor A 404 is equal to a total of the values of currents that flow in the current detection resistor B 1005 and the current detection resistor C 1017. For that reason, outputs of the smoothing means A 406, the smoothing means B 1007, and the smoothing means C 1018 satisfy the following relationship.

(Output of smoothing means $A$)=(Output of smoothing means $B$)+(Output of smoothing means $C$)

Figure 14A:
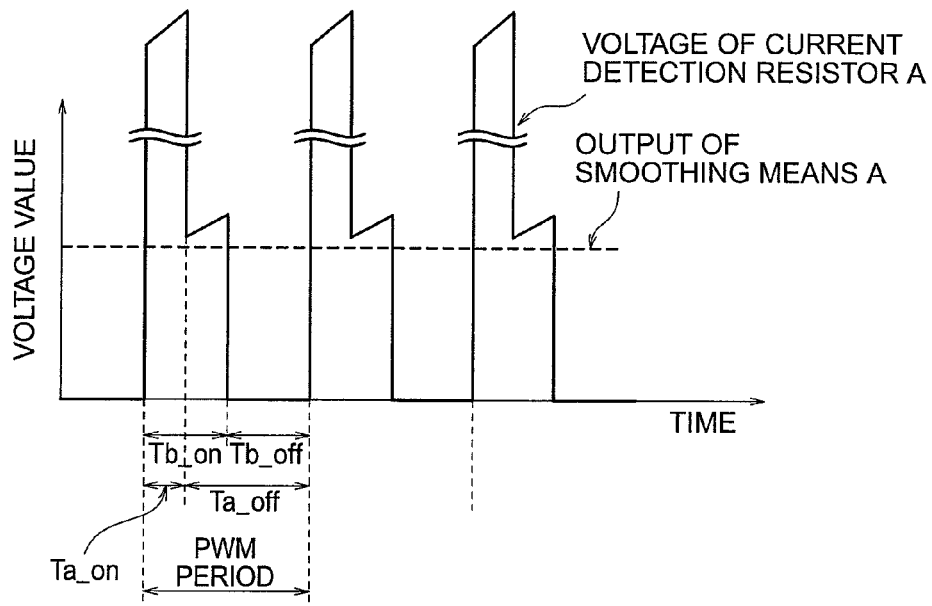
FIGS. 14A, 14B, and 14C are graphs showing the voltages of the respective current detection resistors and the smoothing means when ground short circuit occurs in the device of FIG. 12, respectively.
Figure 14B:
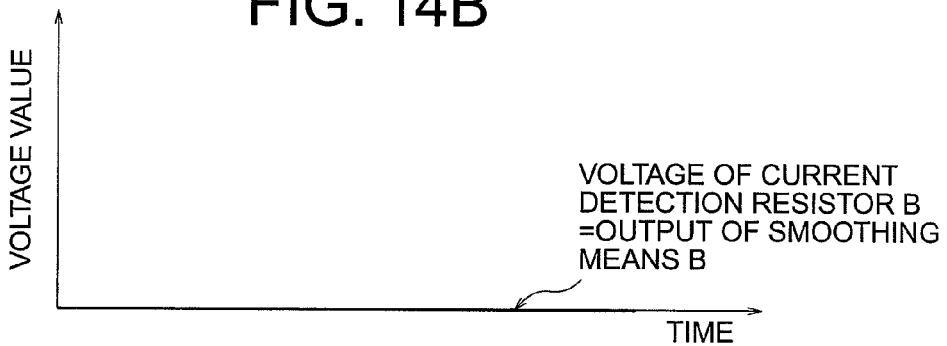
Figure 14C:
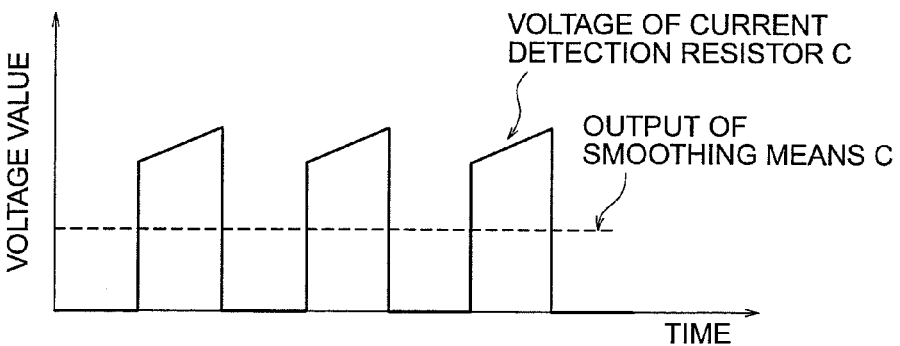

FIGS. 14A, 14B, and 14C show voltages of the current detection resistor A 404, the current detection resistor B 1005, and the current detection resistor C 1017, and output voltages of the smoothing means A 406, the smoothing means B 1007, and the smoothing means C 1018 when the terminal U is short-circuited to ground in a state where the electric power converter A 401 is energized from the terminal U to the terminal V.

FIG. 14A shows the voltage of the current detection resistor A 404 and the output voltage of the smoothing means A 406. In the case where the ground short circuit of the terminal U occurs, when the switching element UH of the electric power converter A 401 is turned on, a current flows along a route of the DC power supply 403, the current detection resistor A 404, the switching element UH, and the short-circuited ground. In the route, no current flows in the motor, whereby the impedance becomes small, and a large current flows. In addition, when the switching element UH of the electric power converter A 401 is turned off, no current flows in the current detection resistor A 404. For that reason, the voltage of the current detection resistor A 404 takes a large value at timing when the switching element UH is turned on. From the above, the output voltage of the smoothing means A 406 increases with respect to the output voltage when no fault occurs.

FIG. 14B shows the voltage of the current detection resistor B 1005 and the output voltage of the smoothing means B 1007. When ground short circuit of the terminal U occurs, all of a current that flows into the electric power converter A 401 from the DC power supply 403 flows in the short-circuited ground. For that reason, a current flowing into the negative terminal of the DC power supply 403 from the DC power supply 403 through the electric power converter A 401 does not flow. That is, the voltage of the current detection resistor B 1005 becomes 0 [V]. Further, the output voltage of the smoothing means B 1007 is also 0 [V]. From the above, the output voltage of the smoothing means B 1007 reduces with respect to the output voltage when no fault occurs.

FIG. 14C shows the voltage of the current detection resistor C 1017 and the output voltage of the smoothing means C 1018. Similarly, when short circuit occurs in the electric power converter A 401, the electric power converter B 402 performs the same operation as in the case where no fault occurs. For that reason, the voltage of the current detection resistor C 1017 and the output voltage of the smoothing means C 1018 are not different from those when no short circuit fault occurs. That is, when ground short circuit occurs, the output voltages of the smoothing means A 406, the smoothing means B 1007, and the smoothing means C 1018 have the following relationship.

(Output voltage of smoothing means $A$)>(Output voltage of smoothing means $B$)+(Output voltage of smoothing means $C$)

The ground short circuit is detected with the aid of the above-mentioned characteristic when the ground short circuit occurs.

Figure 15A:
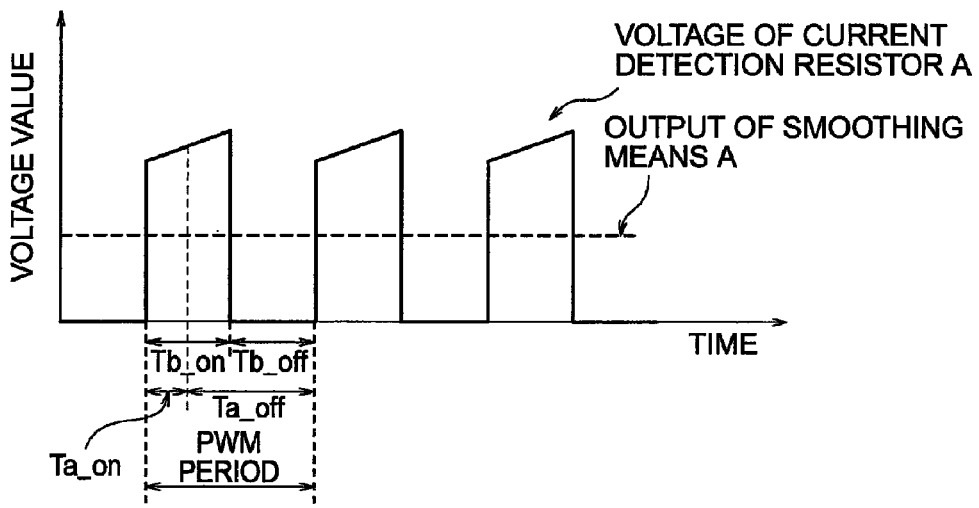
FIGS. 15A, 15B, and 15C are graphs showing the voltages of the respective current detection resistors and the smoothing means when power supply short circuit occurs in the device of FIG. 12, respectively.
Figure 15B:
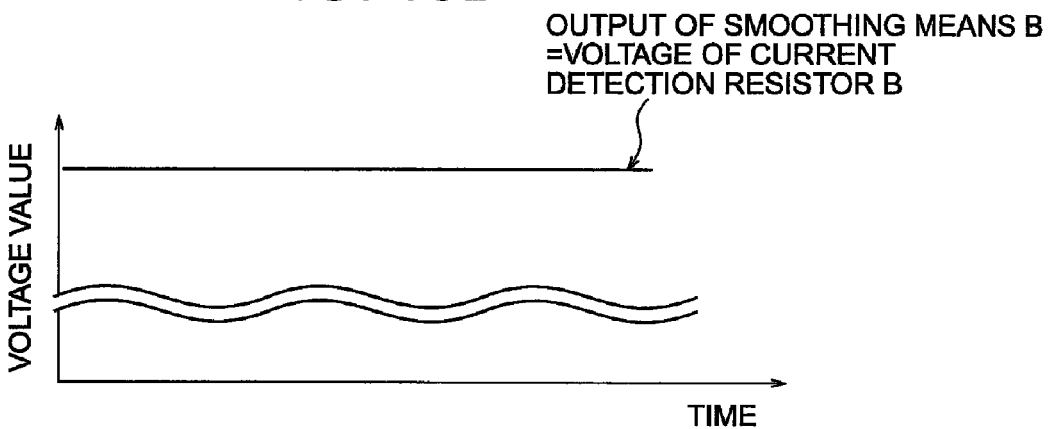
Figure 15C:
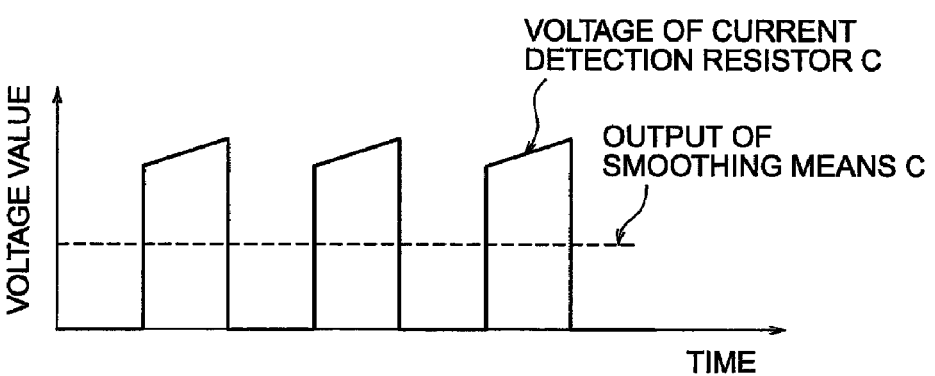

FIGS. 15A, 15B, and 15C show the voltages of the current detection resistor A 404, the current detection resistor B 1005, and the current detection resistor C 1017, and output voltages of the smoothing means A 406, the smoothing means B 1007, and the smoothing means C 1018 when the terminal V is short-circuited to the power supply in a state where the electric power converter A 401 is energized from the terminal U to the terminal V.

FIG. 15A shows the voltage of the current detection resistor A 404 and the output voltage of the smoothing means A 406. In the case where a power supply short circuit occurs, even when the switching element UH is turned on, the potential of the terminal V of the electric power converter A 401, which is short-circuited to the power supply, and the potential of the DC power supply 403 are identical with each other, and a current that flows into the electric power converter A 401 from the DC power supply 403 through the current detection resistor A 404 is 0 [A]. From the above, a current that flows in the current detection resistor A 404 is only a current that flows into the electric power converter B 402 from the DC power supply 403. Accordingly, the output voltage of the smoothing means A 406 when the power supply short circuit occurs becomes smaller than the output voltage of the smoothing means A 406 when no fault occurs.

FIG. 15B shows the voltage of the current detection resistor B 1005 and the output voltage of the smoothing means B 1007. When the terminal V of the electric power converter A 401 is short-circuited to power supply, a current flows in a route of short-circuited power supply, the switching element VL, and the current detection resistor B 1005. In addition, when energization is performed from the terminal U to the terminal V, the switching element VL is always in an on-state. As a result, a current flows in the current detection resistor B 1005 regardless of the on/off operation of the switching element UH of the upper arm. For that reason, the voltage of the current detection resistor B 1005 always maintains a high level. Further, the output of the smoothing means B 1007 becomes larger than the voltage when no fault occurs.

FIG. 15C shows the voltage of the current detection resistor C 1017 and the output voltage of the smoothing means C 1018. Similarly, when short circuit to the power supply occurs in the electric power converter A 401, the electric power converter B 402 can perform the same operation as in the case where no fault occurs. That is, the voltage of the current detection resistor C 1017 and the output voltage of the smoothing means C 1018 are the same as responses when no short circuit fault occurs.

That is, when power supply short circuit occurs, the output voltages of the smoothing means A 406, the smoothing means B 1007, and the smoothing means C 1018 have the following relationship.

(Output voltage of smoothing means *A*)>(Output voltage of smoothing means *B*)+(Output voltage of smoothing means *C*)

The power supply short circuit is detected with the aid of the above-mentioned characteristic when the power supply short circuit occurs.

The ground short circuit and the power supply short circuit are thus detected with the aid of the voltage values smoothed by the smoothing means, whereby it is unnecessary to perform A/D conversion in synchronism with on-timing of the switching elements of the electric power converters, and it is possible to provide an inexpensive motor control device which can be configured to require no high-precision timer. Further, in the motor control device according to the second embodiment, even when the number of motors and the number of electric power converters increase, the number of current detection resistors at the positive terminal side can be one, thereby providing an inexpensive motor control device.

Figure 16:
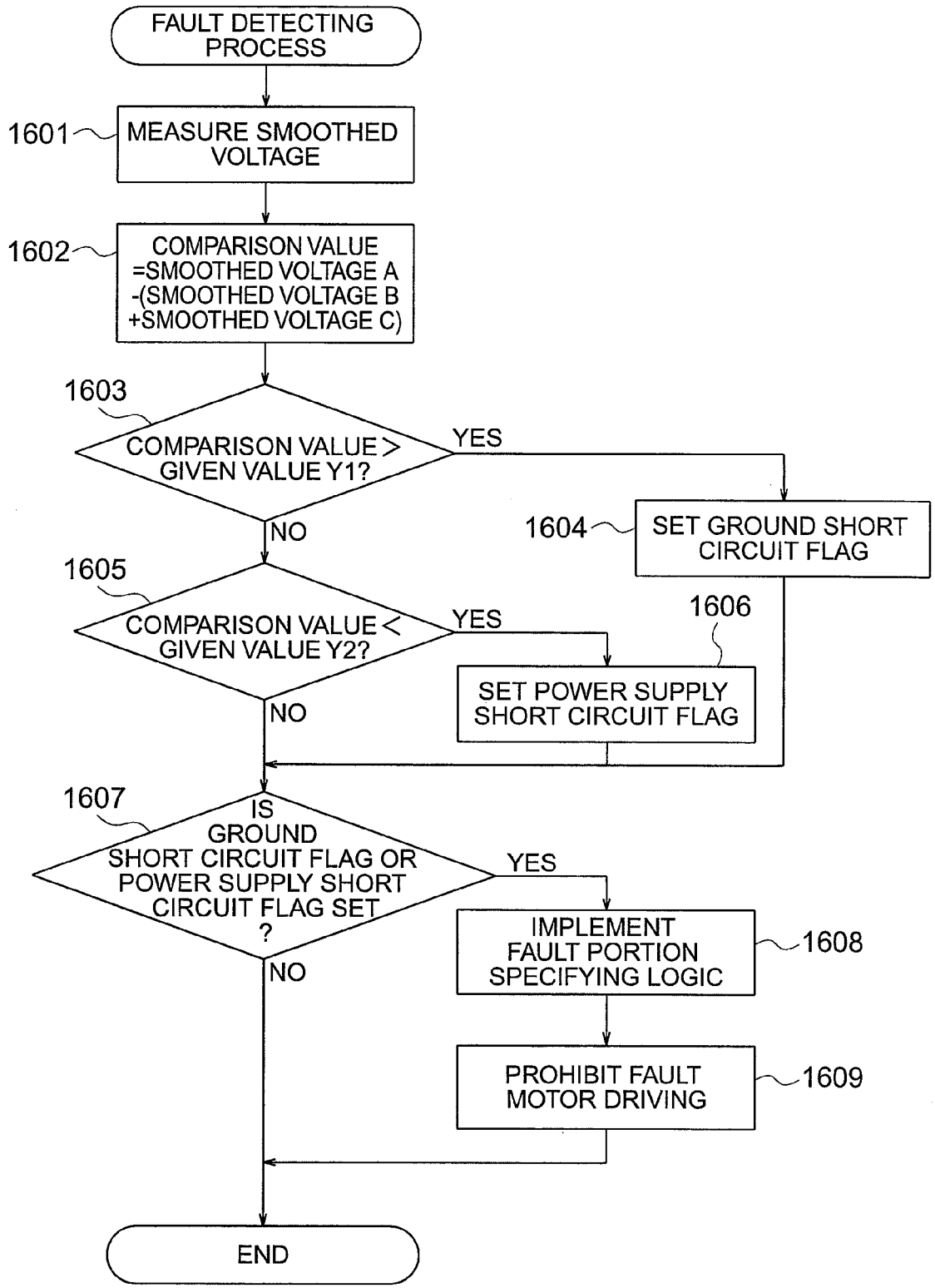
FIG. 16 is a flowchart illustrating an operation flow of the device illustrated in FIG. 12.

FIG. 16 is a flowchart illustrating the operation flow of the motor control device according to the second embodiment. In Step 1601, the output of the smoothing means A 406 is sampled as a smoothed voltage A by the A/D converting means A 415. Further, the output voltage of the smoothing means B 1007 is sampled as a smoothed voltage B by the A/D converting means B 416a, and the output voltage of the smoothing means C 1018 is sampled as a smoothed voltage C by the A/D converting means C 416b.

In Step 1602, the following comparison value is calculated on the basis of the smoothed voltage A, the smoothed voltage B, and the smoothed voltage C which have been sampled in Step 1601 by the output voltage comparing means 410a (sampling control may be performed by the output voltage comparing means).

(Comparison value)=(Smoothed voltage *A*)−
{(Smoothed voltage *B*)+(Smoothed voltage *C*)}

In Step 1603, the comparison value calculated in Step 1602 is compared with a given value X1 in the fault determining means 411a, and when the comparison value is larger than the given value X1 (the given value X1 is a positive number), the output voltage of the smoothing means A 406 is larger than a sum of the output voltage of the smoothing means B 1007 and the output voltage of the smoothing means C 1018, resulting in a status shown in FIGS. 14A, 14B, and 14C. For that reason, it is determined that the ground short circuit occurs, and the processing is advanced to Step 1604, and in other cases, the processing is advanced to Step 1605. In step 1604, the ground short circuit occurs in the fault determining means 411a, and thus a ground short circuit flag is set.

In Step 1605, when the comparison value is smaller than a given value X2 (the given value X2 is a negative value) in the fault determining means 411a, a sum of the output voltage of the smoothing means B 1007 and the output voltage of the smoothing means C 1018 is larger than the output voltage of the smoothing means A 406, resulting in a status shown in FIGS. 15A, 15B, and 15C. For that reason, it is determined that the power supply short circuit occurs, and the processing is advanced to Step 1606. In other cases, the processing is advanced to Step 1607. In Step 1606, the power supply short circuit occurs in the fault determining means 411a, and thus the power supply short circuit flag is set.

In Step 1607, it is confirmed whether or not the ground short circuit flag or the power supply short circuit flag is set in the fault determining means 411a. When any one of those flags is set, the processing is advanced to Step 1608. In other cases, no fault occurs, and thus the fault detecting process is terminated.

In Step 1608, the fault portion is specified in the fault portion specifying means 413a as described later. In Step 1609, driving of the motor that is at fault is prohibited in the motor driving means 1012. In addition, the lamp 135 is lighted, whereby the fault of the motor is notified to a driver.

Figure 17:
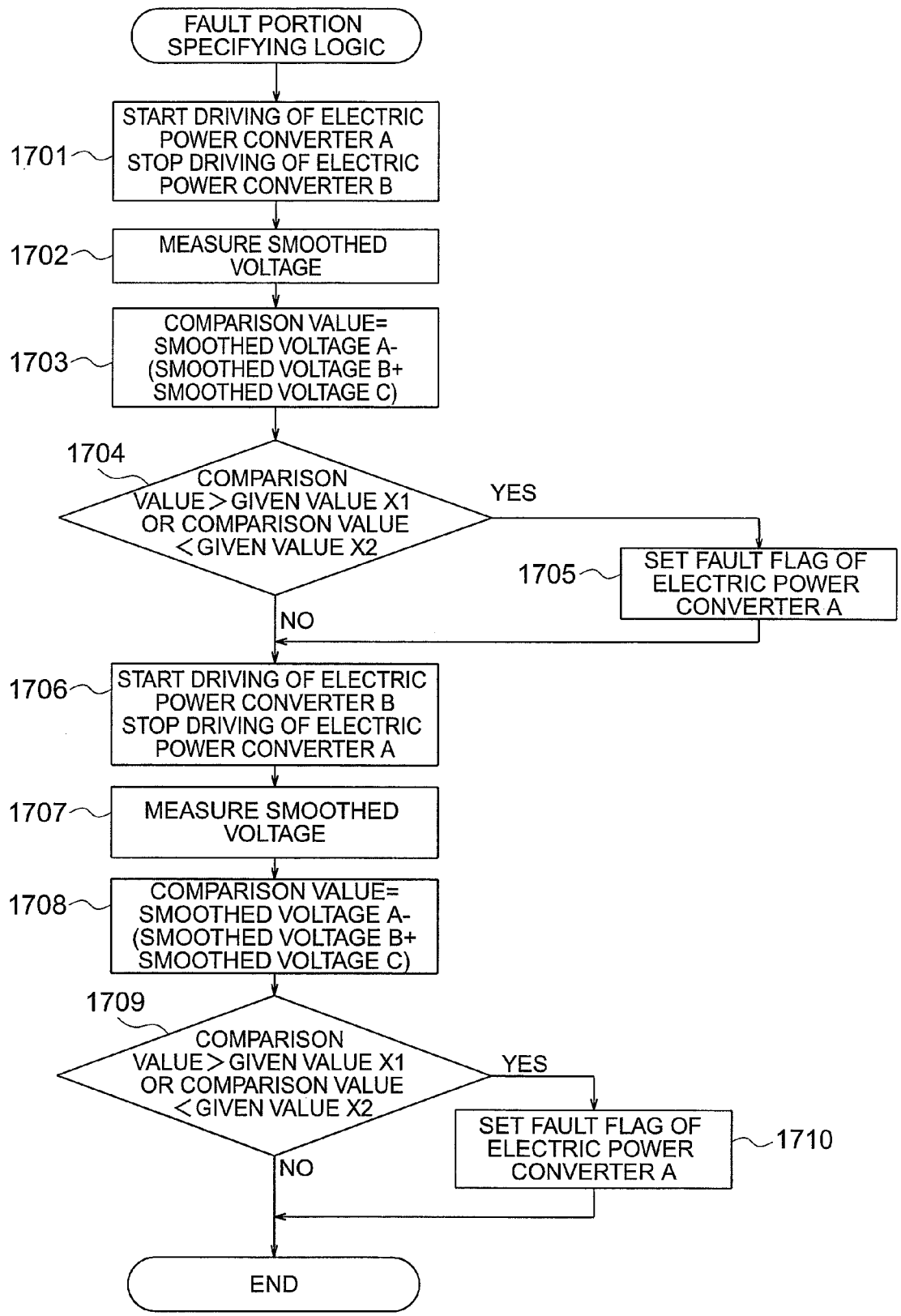
FIG. 17 is a flowchart illustrating a flow of a fault portion specifying logic in Step 1608 of FIG. 16.

FIG. 17 is a flowchart illustrating a flow of a fault portion specifying logic implemented by the fault portion specifying means 413a in Step 1608 of FIG. 16. In Step 1701, the motor driving means 1012 is allowed to drive the switching element so as to energize the shift direction motor 105 in the electric power converter A 401, and all of the switching elements are turned off to stop driving in the electric power converter B 402.

In Step 1702, the output voltage of the smoothing means A 406 is sampled as a smoothed voltage A by the A/D converting means A 415. In addition, the output voltage of the smoothing means B 1007 is sampled as a smoothed voltage B by the A/D converting means B 416a, and the output voltage of the smoothing means C 1018 is sampled as a smoothed voltage C by the A/D converting means C 416b.

In Step 1703, the output voltage comparing means 410a is allowed to calculate the following comparison value on the basis of the smoothed voltage A, the smoothed voltage B, and the smoothed voltage C which have been sampled in Step 1702.

(Comparison value)=(Smoothed voltage *A*)−
{(Smoothed voltage *B*)+(Smoothed voltage *C*)}

In Step 1704, in the fault determining means 411a, when the comparison value is larger than the given value X1 (the given value X1 is a positive value), or when the comparison value is smaller than the given value X2 (the given value X2 is a negative value), the processing is advanced to Step 1705, and in other cases, the processing is advanced to Step 1506. In Step 1705, in the fault portion specifying means 413a, the ground short circuit or the power supply short circuit occurs in the electric power converter A 401, and thus the electric power converter fault flag is set.

In Step 1706, the motor driving means 1012 is allowed to turn off all of the switching elements and stop the driving in the electric power converter A 401, and to drive the switching elements so as to energize the select direction motor 106 in the electric power converter B 402. In Step 1707, the output voltage of the smoothing means A 406 is sampled as a smoothed voltage A by the A/D converting means A 415. In addition, the output voltage of the smoothing means B 1007 is sampled as a smoothed voltage B by the A/D converting means B 416a, and the output voltage of the smoothing means C 1018 is sampled as a smoothed voltage C by the A/D converting means C 416b.

In Step 1708, the output voltage comparing means 410a is allowed to calculate the following comparison value on the basis of the smoothed voltage A, the smoothed voltage B, and the smoothed voltage C which have been sampled in Step 1707.

(Comparison value)=(Smoothed voltage *A*)−
{(Smoothed voltage *B*)+(Smoothed voltage *C*)}

In Step 1709, in the fault determining means 1011, when the comparison value is larger than the given value X1 (the given value X1 is a positive value), or when the comparison value is smaller than the given value X2 (the given value X2 is a negative value), the processing is advanced to Step 1710, and in other cases, the specifying of the fault portion is terminated. In Step 1710, in the fault portion specifying means 413*a*, the ground short circuit or the power supply short circuit occurs in the electric power converter B 402, and hence the electric power converter fault flag is set.

As described above, when the ground short circuit or the power supply short circuit is detected by the current detection resistor, the electric power converter A 401 and the electric power converter B 402 are driven in turn, whereby the fault portion can be specified. Further, the provision of an additional circuit is not required in order to specify the fault portion, whereby it is possible to provide a motor control device with an inexpensive configuration.

The present invention is not limited to the respective embodiments described above, and it is needless to say that the available combinations or partial combinations of those embodiments are also included in the present invention. For example, the present invention includes a motor control device which has the functions of the fault portion specifying means of both the motor control device according to the first embodiment illustrated in FIG. 4 and the motor control device according to the second embodiment illustrated in FIG. 12 together.

What is claimed is:

1. A motor control device, comprising:
    a DC power supply for feeding power to a plurality of motors;
    a plurality of electric power converters connected in parallel to the DC power supply, for performing power conversion of the fed power to drive the plurality of motors, respectively;
    motor driving means for controlling drive/stop of the plurality of electric power converters according to a motor drive command;
    a first current detection resistor connected between a point to which positive terminal sides of the plurality of electric power converters are connected and the DC power supply;
    fault detecting means for detecting a short circuit fault based on a voltage of the first current detection resistor; and
    a second current detection resistor connected between a point to which negative terminal sides of the plurality of electric power converters are connected and the DC power supply,
    wherein the fault detecting means detects the short circuit fault based on the voltage of the first current detection resistor and a voltage of the second current detection resistor.

2. A motor control device, comprising:
    a DC power supply for feeding power to a plurality of motors;
    a plurality of electric power converters connected in parallel to the DC power supply, for performing power conversion of the fed power to drive the plurality of motors, respectively;
    motor driving means for controlling drive/stop of the plurality of electric power converters according to a motor drive command;
    a first current detection resistor connected between a point to which positive terminal sides of the plurality of electric power converters are connected and the DC power supply;
    fault detecting means for detecting a short circuit fault based on a voltage of the first current detection resistor; and
    a third current detection resistor connected between each of negative terminal sides of the plurality of electric power converters and the DC power supply,
    wherein the fault detecting means detects the short circuit fault based on the voltage of the first current detection resistor and a voltage of the third current detection resistor.

3. The motor control device according to claim 1, further comprising:
    first smoothing means for smoothing the voltage of the first current detection resistor; and
    second smoothing means for smoothing the voltage of the second current detection resistor,
    wherein the fault detecting means comprises:
    output voltage comparing means for comparing an output voltage of the first smoothing means and an output voltage of the second smoothing means with each other; and
    fault detecting means for detecting the short circuit fault according to an output of the output voltage comparing means.

4. The motor control device according to claim 2, further comprising:
    first smoothing means for smoothing the voltage of the first current detection resistor; and
    third smoothing means for smoothing the voltage of the third current detection resistor,
    wherein the fault detecting means comprises:
    output voltage comparing means for comparing an output voltage of the first smoothing means and an output voltage of the third smoothing means with each other; and
    fault detecting means for determining the fault detection according to an output of the output voltage comparing means.

5. A motor control device, comprising:
    a DC power supply for feeding power to a plurality of motors;
    a plurality of electric power converters connected in parallel to the DC power supply, for performing power conversion of the fed power to drive the plurality of motors, respectively;
    motor driving means for controlling drive/stop of the plurality of electric power converters according to a motor drive command;
    a first current detection resistor connected between a point to which positive terminal sides of the plurality of electric power converters are connected and the DC power supply;
    fault detecting means for detecting a short circuit fault based on a voltage of the first current detection resistor; and
    terminal voltage measuring means for measuring terminal voltages of the plurality of motors,
    wherein the fault detecting means comprises fault portion specifying means for specifying an occurrence portion of the short circuit fault according to the terminal voltages of the plurality of motors, and
    wherein when the fault detecting means determines that the short circuit fault occurs, the fault portion specifying means turns off all switching elements of all of the plurality of electric power converters by the motor driving means, and determines which one of the plurality of electric power converters and the plurality of motors is at fault based on the terminal voltages of the plurality of motors, which are measured by the terminal voltage measuring means.

6. The motor control device according to claim 1, further comprising terminal voltage measuring means for measuring terminal voltages of the plurality of motors,
   wherein the fault detecting means comprises fault portion specifying means for specifying an occurrence portion of the short circuit fault according to the terminal voltages of the plurality of motors, and
   wherein when the fault detecting means determines that the short circuit fault occurs, the fault portion specifying means turns off all switching elements of all of the plurality of electric power converters by the motor driving means, and determines which one of the plurality of electric power converters and the plurality of motors is at fault based on the terminal voltages of the plurality of motors, which are measured by the terminal voltage measuring means.

7. The motor control device according to claim 2, further comprising terminal voltage measuring means for measuring terminal voltages of the plurality of motors,
   wherein the fault detecting means comprises fault portion specifying means for specifying an occurrence portion of the short circuit fault according to the terminal voltages of the plurality of motors, and
   wherein when the fault detecting means determines that the short circuit fault occurs, the fault portion specifying means turns off all switching elements of all of the plurality of electric power converters by the motor driving means, and determines which one of the plurality of electric power converters and the plurality of motors is at fault based on the terminal voltages of the plurality of motors, which are measured by the terminal voltage measuring means.

8. The motor control device according to claim 3, further comprising terminal voltage measuring means for measuring terminal voltages of the plurality of motors,
   wherein the fault detecting means comprises fault portion specifying means for specifying an occurrence portion of the short circuit fault according to the terminal voltages of the plurality of motors, and
   wherein when the fault detecting means determines that the short circuit fault occurs, the fault portion specifying means turns off all switching elements of all of the plurality of electric power converters by the motor driving means, and determines which one of the plurality of electric power converters and the plurality of motors is at fault based on the terminal voltages of the plurality of motors, which are measured by the terminal voltage measuring means.

9. The motor control device according to claim 4, further comprising terminal voltage measuring means for measuring terminal voltages of the plurality of motors,
   wherein the fault detecting means comprises fault portion specifying means for specifying an occurrence portion of the short circuit fault according to the terminal voltages of the plurality of motors, and
   wherein when the fault detecting means determines that the short circuit fault occurs, the fault portion specifying means turns off all switching elements of all of the plurality of electric power converters by the motor driving means, and determines which one of the plurality of electric power converters and the plurality of motors is at fault based on the terminal voltages of the plurality of motors, which are measured by the terminal voltage measuring means.

10. A motor control device, comprising:
    a DC power supply for feeding power to a plurality of motors;
    a plurality of electric power converters connected in parallel to the DC power supply, for performing power conversion of the fed power to drive the plurality of motors, respectively;
    motor driving means for controlling drive/stop of the plurality of electric power converters according to a motor drive command;
    a first current detection resistor connected between a point to which positive terminal sides of the plurality of electric power converters are connected and the DC power supply; and
    fault detecting means for detecting a short circuit fault based on a voltage of the first current detection resistor,
    wherein the fault detecting means comprises fault portion specifying means for specifying an occurrence portion of the short circuit fault according to the voltage of the first current detection resistor, and
    wherein when the fault detecting means determines that the short circuit fault occurs, the fault portion specifying means sequentially drives and stops the plurality of electric power converters one by one by the motor driving means, and specifies which one of the plurality of motors is at fault according to a fault detection result obtained when the plurality of electric power converters are sequentially driven and stopped.

11. The motor control device according to claim 1,
    wherein the fault detecting means comprises fault portion specifying means for specifying an occurrence portion of the short circuit fault according to the voltage of the first current detection resistor, and
    wherein when the fault detecting means determines that the short circuit fault occurs, the fault portion specifying means sequentially drives and stops the plurality of electric power converters one by one by the motor driving means, and specifies which one of the plurality of motors is at fault according to a fault detection result obtained when the plurality of electric power converters are sequentially driven and stopped.

12. The motor control device according to claim 2,
    wherein the fault detecting means comprises fault portion specifying means for specifying an occurrence portion of the short circuit fault according to the voltage of the first current detection resistor, and
    wherein when the fault detecting means determines that the short circuit fault occurs, the fault portion specifying means sequentially drives and stops the plurality of electric power converters one by one by the motor driving means, and specifies which one of the plurality of motors is at fault according to a fault detection result obtained when the plurality of electric power converters are sequentially driven and stopped.

13. The motor control device according to claim 3,
    wherein the fault detecting means comprises fault portion specifying means for specifying an occurrence portion of the short circuit fault according to the voltage of the first current detection resistor, and
    wherein when the fault detecting means determines that the short circuit fault occurs, the fault portion specifying means sequentially drives and stops the plurality of electric power converters one by one by the motor driving means, and specifies which one of the plurality of motors is at fault according to a fault detection result obtained when the plurality of electric power converters are sequentially driven and stopped.

14. The motor control device according to claim 4,
wherein the fault detecting means comprises fault portion specifying means for specifying an occurrence portion of the short circuit fault according to the voltage of the first current detection resistor, and
wherein when the fault detecting means determines that the short circuit fault occurs, the fault portion specifying means sequentially drives and stops the plurality of electric power converters one by one by the motor driving means, and specifies which one of the plurality of motors is at fault according to a fault detection result obtained when the plurality of electric power converters are sequentially driven and stopped.

* * * * *